(12) United States Patent
Facchetti et al.

(10) Patent No.: US 8,940,579 B2
(45) Date of Patent: Jan. 27, 2015

(54) LOW-TEMPERATURE FABRICATION OF METAL OXIDE THIN FILMS AND NANOMATERIAL-DERIVED METAL COMPOSITE THIN FILMS

(71) Applicants: Northwestern University, Evanston, IL (US); Polyera Corporation, Skokie, IL (US)

(72) Inventors: Antonio Facchetti, Chicago, IL (US); Tobin J. Marks, Evanston, IL (US); Mercouri G. Kanatzidis, Wilmette, IL (US); Myung-Gil Kim, Evanston, IL (US); William Christopher Sheets, Chicago, IL (US); He Yan, Hong Kong (CN); Yu Xia, Skokie, IL (US)

(73) Assignees: Northwestern University, Evanston, IL (US); Polyera Corporation, Skokie, IL (US)

( * ) Notice: Subject to any disclaimer, the term of this patent is extended or adjusted under 35 U.S.C. 154(b) by 0 days.

(21) Appl. No.: 13/844,771

(22) Filed: Mar. 15, 2013

(65) Prior Publication Data

US 2013/0217180 A1 Aug. 22, 2013

Related U.S. Application Data

(63) Continuation of application No. PCT/US2012/023042, filed on Jan. 27, 2012.

(60) Provisional application No. 61/462,125, filed on Jan. 28, 2011, provisional application No. 61/502,644, filed on Jun. 29, 2011.

(51) Int. Cl.
*H01L 21/441* (2006.01)
*H01L 21/02* (2006.01)
(Continued)

(52) U.S. Cl.
CPC ...... *H01L 21/02565* (2013.01); *C23C 18/1216* (2013.01); *C23C 18/1225* (2013.01);
(Continued)

(58) Field of Classification Search
CPC .............. H01L 21/02565; H01L 21/02172; H01L 21/28506; H01L 21/441; H01L 29/66969
USPC ........................................ 438/104, 608, 778
See application file for complete search history.

(56) References Cited

U.S. PATENT DOCUMENTS 4,252,841 A  2/1981  Kinugawa et al. ............ 427/108
4,268,539 A  5/1981  Nakayama et al. ........... 427/108
(Continued)

OTHER PUBLICATIONS

Basu et al: "Liquid-Phase Deposition of $Al_2O_3$ Thin Films on GaN," *Journal of the Electrochemical Society*, vol. 154, No. 12, pp. H1041-H1046 (2007).
(Continued)

*Primary Examiner* — Olik Chaudhuri
*Assistant Examiner* — Christine Enad
(74) *Attorney, Agent, or Firm* — Karen K. Chan

(57) ABSTRACT

Disclosed are new methods of fabricating metal oxide thin films and nanomaterial-derived metal composite thin films via solution processes at low temperatures (<400° C.). The present thin films are useful as thin film semiconductors, thin film dielectrics, or thin film conductors, and can be implemented into semiconductor devices such as thin film transistors and thin film photovoltaic devices.

15 Claims, 11 Drawing Sheets a)

b)

c)

d)

(51) Int. Cl.
*C23C 18/12* (2006.01)
*H01L 29/66* (2006.01)
*H01L 21/285* (2006.01)
*H01L 29/786* (2006.01)

(52) U.S. Cl.
CPC ........... *C23C18/127* (2013.01); *C23C 18/1237* (2013.01); *C23C 18/125* (2013.01); *H01L 21/02172* (2013.01); *H01L 21/441* (2013.01); *H01L 29/66969* (2013.01); *H01L 21/28506* (2013.01); *H01L 29/66742* (2013.01); *H01L 29/78693* (2013.01)
USPC ............. 438/104; 438/46; 438/149; 438/479; 438/483; 438/590; 438/591; 438/602; 438/609; 257/43

(56) References Cited

U.S. PATENT DOCUMENTS

| | | | |
|---|---|---|---|
| 5,714,236 | A | 2/1998 | Withington et al. ........... 428/195 |
| 6,495,709 | B1* | 12/2002 | Celinska et al. ............... 556/183 |
| 8,017,458 | B2 | 9/2011 | Marks et al. ................... 438/149 |
| 8,513,646 | B2 | 8/2013 | Marks et al. ..................... 257/24 |
| 2008/0286907 | A1 | 11/2008 | Li et al. .......................... 438/141 |
| 2008/0296567 | A1* | 12/2008 | Irving et al. ..................... 257/43 |
| 2010/0006837 | A1* | 1/2010 | Cho et al. ......................... 257/43 |
| 2010/0119939 | A1* | 5/2010 | Misumi et al. ................. 429/212 |
| 2010/0163863 | A1* | 7/2010 | Yaegashi ......................... 257/43 |
| 2010/0184253 | A1 | 7/2010 | Hirai et al. ..................... 438/104 |
| 2010/0258793 | A1* | 10/2010 | Seon et al. ....................... 257/43 |

OTHER PUBLICATIONS

Biswas et al: "Surface Characterization of Sol-Gel Derived Indium Tin Oxide Films on Glass," *Bull. Mater. Sci.*, vol. 29, No. 3, pp. 323-330 (2006).

Biswas et al: "Work Function of Sol-Gel Indium Tin Oxide (ITO) Films on Glass," *Applied Surface Science*, vol. 253, pp. 1953-1959 (2006).

Chu et al: "Plasma-Enhanced Flexible Metal-Insulator-Metal Capacitor Using High-k $ZrO_2$ Film as Gate Dielectric with Improved Reliability," *Microelectronics Reliability*, vol. 50, pp. 1098-1102 (2010).

Exarhos et al: "Deposition and Characterization of Multicomponent Oxide Films and Multilayers from Aqueous Solution" *Thin Solid Films*, vol. 236, pp. 51-57 (1993).

Kim et al.: "Low-Temperature Fabrication of High-Performance Metal Oxide Thin-Film Electronics Via Combustion Procession" *Nature Materials*, vol. 10, pp. 382-388 (Apr. 17, 2011).

Lee et al.: "Electrical and Optical Properties of $In_2O_3$-ZnO Thin Films Prepared by Sol-Gel Method," *Thin Solid Films*, vol. 484, pp. 184-187 (2005).

* cited by examiner a)

LOW-TEMPERATURE FABRICATION OF METAL OXIDE THIN FILMS AND NANOMATERIAL-DERIVED METAL COMPOSITE THIN FILMS

CROSS-REFERENCE TO RELATED APPLICATIONS

This application is a continuation of International Application No. PCT/US2012/023042, filed on Jan. 27, 2012, which claims priority to and the benefit of U.S. Provisional Patent Application Ser. No. 61/462,125, filed on Jan. 28, 2011, and U.S. Provisional Patent Application Ser. No. 61/502,644, filed on Jun. 29, 2011, the disclosure of each of which is incorporated by reference herein in its entirety.

STATEMENT REGARDING FEDERALLY SPONSORED RESEARCH OR DEVELOPMENT

This invention was made with government support under FA9550-08-1-0331 awarded by the Air Force Office of Scientific Research and DMR0520513 awarded by the National Science Foundation. The government has certain rights in the invention.

BACKGROUND

Recent research efforts on macroelectronics promise revolutionary applications such as transparent, flexible flat panel displays, solar cells, and large area sensor arrays. The emerging materials to achieve these functions include organic semiconductors, carbon-based semiconductors, and various inorganic nanomaterials. However, metal oxide electronics hold perhaps the greatest promise, with demonstrated large-area compatibility and impressive device performance (electron mobility up to ~100 cm$^2$/Vs) compared to the current dominant hydrogenated amorphous silicon (a-Si:H) technology (electron mobility ~1 cm$^2$/Vs). These promising properties have triggered efforts to fabricate oxide electronics on flexible plastic substrates compatible with low-cost, high-throughput solution-processing.

Despite its promise, solution processing of metal oxide electronics typically requires high annealing temperatures (e.g., $T_{anneal} \geq 400°$ C.). For example, in conventional sol-gel approaches, a metal precursor (e.g., a metal salt) is used in combination with a base (typically a Bronsted base as a catalyst) and an organic stabilizer (e.g., a ligand compound) to synthesize a sol solution, which is then spun on the substrate. The metal precursor, typically metal alkoxides or metal chlorides, undergoes hydrolysis and polycondensation reactions to form a gel. Formation of the metal oxide involves connecting the metal centers with oxo (M-O-M) bridges, therefore generating metal-oxo and, for partial connections, metal-hydroxo (M-OH—HO-M) polymers in solution. To densify the metal oxide, that is, to convert the (M-OH—HO-M) to (M-O-M) lattice by eliminating H$_2$O and to completely burn off the organic portion of the metal oxide film, sintering at high temperatures ($\geq 400°$ C.) is necessary. As such, current solution-phase techniques employed to process metal oxide films generally are incompatible with inexpensive flexible plastic substrates. The limitations posed by these high processing temperatures have prevented oxide materials from being implemented in large-area flexible macroelectronics.

Furthermore, when metal oxide thin films are derived from pre-formed nanomaterial solutions, an organic ligand similarly is needed to stabilize the solution. Thus after spin-coating, sintering of the resulting nanomaterial films at high temperatures (e.g., >400° C.) again is necessary to remove the ligand. Otherwise, the residual ligands within the film can lead to poor morphological and electrical connections between the nanomaterials, hindering charge carrier transport and limiting the corresponding device performance.

Accordingly, there is a need in the art for new precursor systems and solution-phase processes that can be used to fabricate electronic metal oxide thin films at low temperatures.

SUMMARY

In light of the foregoing, the present teachings provide methods that can be used to achieve the solution deposition of diverse electronic metal oxide films at low temperatures. In particular, the present methods can be used to prepare electrically functional metal oxide films at annealing temperatures generally below about 400° C., and as low as about 150° C. The present teachings also relate to the implementation of the resulting films in various semiconductor devices. In particular, high-performance transistors on inexpensive and/or flexible substrates can be achieved by implementing the present metal oxide films as the electrically transporting (e.g., the semiconductor and/or any of the source, drain, and gate electrode(s)) and/or the electrically insulating (e.g., the gate dielectric) component(s). Other semiconductor devices can include solar cells, sensors, light-emitting transistors and circuits.

In one aspect, the present teachings provide formulations that can be used to prepare metal oxide thin film semiconductors, metal oxide thin film dielectrics, and/or metal oxide thin film conductors via solution-phase processes at low temperatures.

A formulation (or precursor composition) according to the present teachings generally includes a fuel and one or more oxidizing agents in a solvent or solvent mixture, where the fuel and the oxidizing agent(s) form a redox pair, and where the fuel and each of the oxidizing agent(s) are at least partially soluble in the solvent or solvent mixture. The oxidizing agent can be a metal reagent comprising an oxidizing anion, an inorganic reagent comprising an oxidizing anion, or an oxidizing acid. The fuel generally can be described as an organic compound or organic anion capable of releasing energy (i.e., heat) by the process of oxidation. Accordingly, the fuel can be an organic fuel, a metal reagent comprising a fuel anion, or an inorganic reagent comprising a fuel anion. The solvent or solvent mixture can include an alcohol. In some embodiments, either the oxidizing agent and/or the fuel can comprise a metal reagent comprising a metal selected from a Group 12 metal, a Group 13 metal, a Group 14 metal, a Group 15 metal, a transition metal (any Group 3 to Group 11 metal), or a lanthanide. In other embodiments where neither the oxidizing agent nor the fuel comprises a metal reagent, a metal salt (e.g., a metal halide) can be added to the precursor composition in addition to the fuel and the oxidizing agent. The precursor composition also can include a base.

Unlike conventional precursors based on sol-gel approaches, which convert the precursor into metal oxides via an endothermic reaction, the oxidizing agent and the fuel in the present formulations react to induce a self-energy generating combustion. The self-generated heat from the precursors' reaction provides a localized energy supply, thereby eliminating the need for high, externally applied processing temperatures to drive the completion of the metal oxide lattice. Therefore, the present formulations allow metal oxide formation at temperatures much lower than through the use of conventional sol-gel precursors.

More generally, the present teachings relate to a method of preparing a metal oxide thin film that can be used as an electrically transporting or insulating component in a semiconductor device. The present method can include (a) depositing a thin film from a precursor composition described herein; (b) annealing the thin film at a temperature less than or about 350° C.; and carrying out steps (a) and (b) one or more times by depositing an overlying thin film on any previously deposited and annealed thin film, where each film formed by a single cycle of steps (a) and (b) has a thickness of less than or about 50 nm, thereby achieving a fully dense metal oxide thin film. The annealing step can be carried out by conventional heat treatment (e.g., in an oven) and/or by exposure to a radiation source (e.g., infrared (IR) radiation, ultraviolet radiation, eximer laser radiation, microwave radiation).

The present low temperature-processed metal oxide thin films can be incorporated into articles of manufacture such as field effect transistors (e.g., thin film transistors), photovoltaics, organic light emitting devices such as organic light emitting diodes (OLEDs) and organic light emitting transistors (OLETs), complementary metal oxide semiconductors (CMOSs), complementary inverters, D flip-flops, rectifiers, ring oscillators, solar cells, photovoltaic devices, photodetectors, and sensors. The present low temperature-processed metal oxide thin films can provide advantageous field-effect mobilities, which, without wishing to be bound by any particular theory, can be achieved through improved film texturing and/or interfacial and related morphological considerations.

The present low temperature solution-processed metal oxide thin films can be combined with metal oxide (e.g., IGZO), nitride (e.g., $Si_3N_4$), arsenite (e.g., GaAs), or organic semiconductor (e.g., rylenes, donor-acceptor blends) films deposited via other solution-phase processes or conventional methods such as thermal evaporation and various physical and chemical vapor deposition techniques (e.g., sputtering, plasma-enhanced chemical vapor deposition (PECVD), atomic layer deposition (ALD), pulsed laser deposition (PLD), and ion-assisted deposition (IAD)) to produce hybrid multilayers.

Accordingly, the present teachings also can relate to a method of fabricating a thin film transistor that includes a thin film semiconductor, a thin film dielectric, a thin film gate electrode, and source and drain electrodes, where the method can include coupling the thin film semiconductor to the thin film dielectric and coupling the thin film dielectric to the thin film gate electrode. Specifically, the thin film semiconductor can be coupled to the thin film dielectric by contacting the thin film dielectric with a semiconductor precursor composition, where the semiconductor precursor composition can include at least one oxidizing agent and a fuel in a solvent or solvent mixture as described herein. The semiconductor precursor composition in contact with the thin film dielectric can be annealed to a temperature of less than or about 350° C. to provide a metal oxide thin film semiconductor having a thickness of less than or about 50 nm. Following the annealing step, a new cycle including the contacting step and the annealing step can be repeated one or more times to increase the thickness of the final metal oxide thin film semiconductor.

In another aspect, the present teachings provide nanomaterial-derived metal oxide or metal oxide/metal composite thin films having electronic properties suitable for use in various semiconductor devices. More specifically, the present teachings provide metal oxide thin films deposited from either a single dispersion or separate dispersions of a metal oxide nanomaterial and a binder composition that includes the combustion precursors (i.e., an oxidizing agent and a fuel) as described herein. The metal oxide nanomaterial can be selected from a metal oxide nanoparticle, a metal oxide nanosphere, a metal oxide nanowire, a metal oxide nanoribbon, a metal oxide nanorod, a metal oxide nanotube, a metal oxide nanosheet, and combinations thereof. The metal component of the metal oxide nanomaterial can include a Group 12 metal, a Group 13 metal, a Group 14 metal, a Group 15 metal, a transition metal, or a lanthanide. In various embodiments, either the oxidizing agent and/or the fuel can comprise the same metal as the metal oxide nanomaterial. The dispersion(s) of the metal oxide nanomaterial and/or the oxidizing agent(s) and the fuel can include a solvent or a solvent mixture that includes an alcohol.

In some embodiments, the nanomaterial-derived metal oxide or metal oxide/metal composite thin film can be prepared from separate dispersions of the nanomaterial and the binder composition. More specifically, a first thin film layer can be deposited from a first dispersion including the metal oxide or metal nanomaterial in a solvent or a solvent mixture. This first thin film layer can have a typical thickness ranging from about 5 nm to about 1000 nm, which optionally can be annealed at a temperature of less than or about 350° C. under an oxygen-containing, reducing, or inert atmosphere. Following the deposition of the nanomaterial dispersion, a binder composition which includes the combustion precursors can be deposited one or more times (i.e., in one or more deposition cycles) to provide a second thin film layer that has a typical thickness ranging from about 5 nm to about 100 nm. This binder composition can help fill the physical gaps between nanomaterials. In various embodiments, each deposition cycle can provide a binder sublayer that has a typical thickness of less than or about 50 nm. In some embodiments, an annealing step can be performed between each two deposition cycles. In other embodiments, the second thin film layer is annealed once at the end of the multiple deposition cycles. The annealing step(s) typically are performed at a temperature of less than or about 350° C.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

Figure 4:
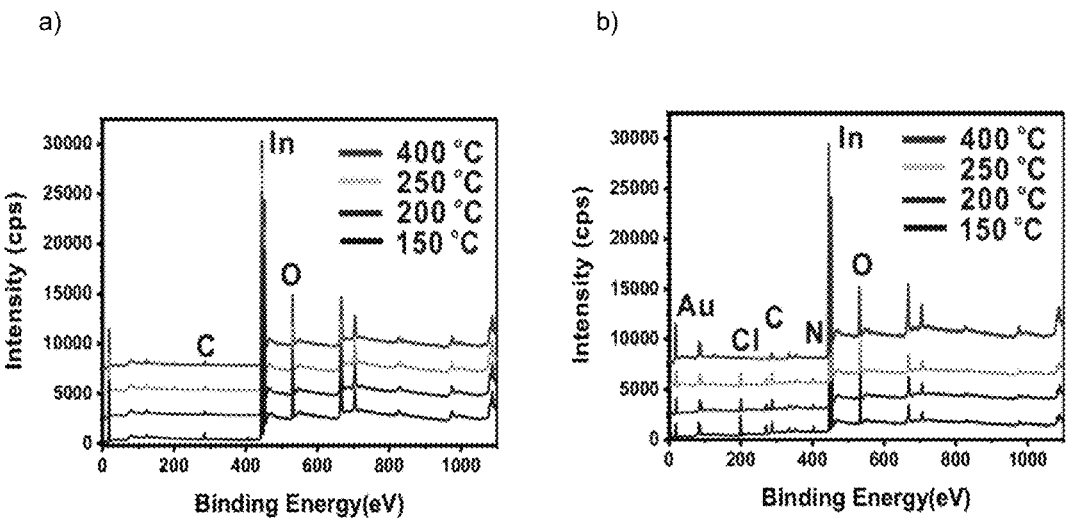

FIGS. 4a-b show XPS spectra of $In_2O_3$ films deposited with (a) combustion precursors according to the present teachings and (b) conventional precursors and annealed at 400° C., 250° C., 200° C., and 150° C. (top to bottom).

Figure 5:
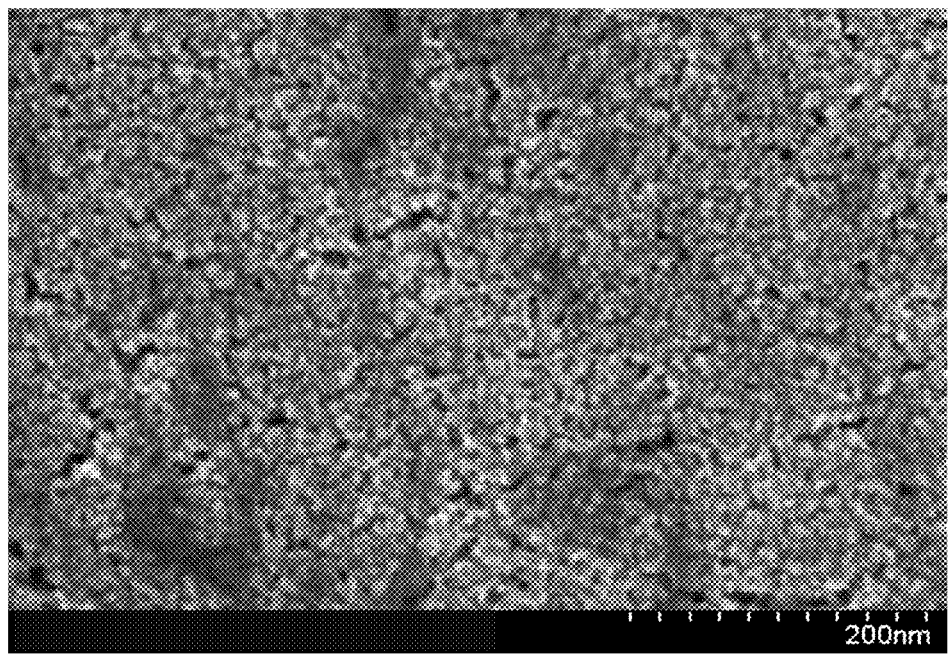
Figure 5:
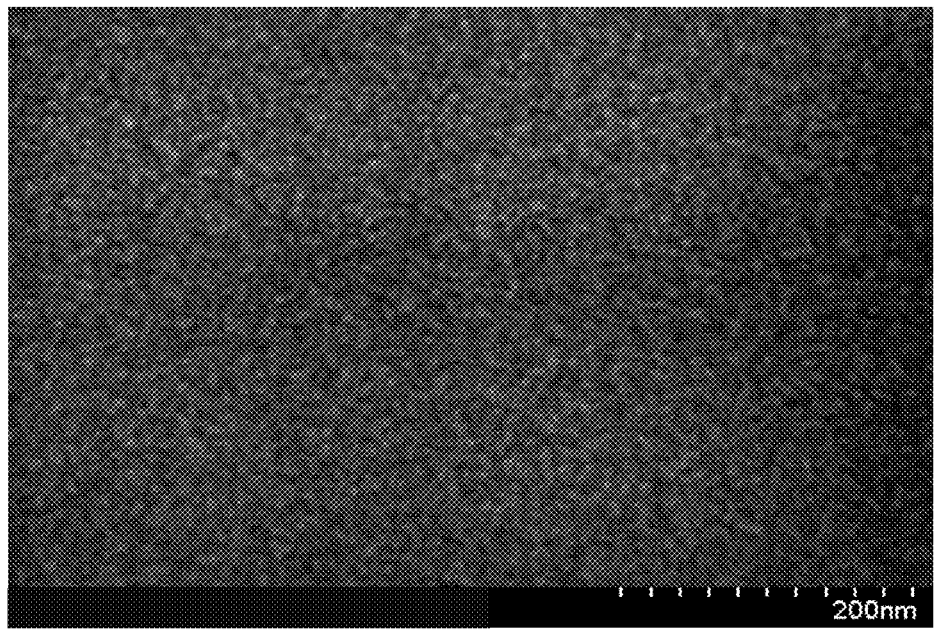

FIGS. 5a-b show scanning electron microscopy (SEM) images of (a) an 80 nm-thick combustion precursor-derived $In_2O_3$ film obtained by deposition of a single layer ($NH_3$/In=4) and (b) an 80 nm-thick combustion precursor-derived $In_2O_3$ film obtained by deposition of four 20 nm-thick layers ($NH_3$/In=2).

FIGS. 6a-c compare the mobilities ($\mu^{sat}$) of (a) $In_2O_3$, (b) ZTO, and (c) IZO thin film transistors derived from combustion precursors (circle symbols) versus conventional precursors (square symbols) fabricated at different annealing temperatures.

Figures 6, 7:
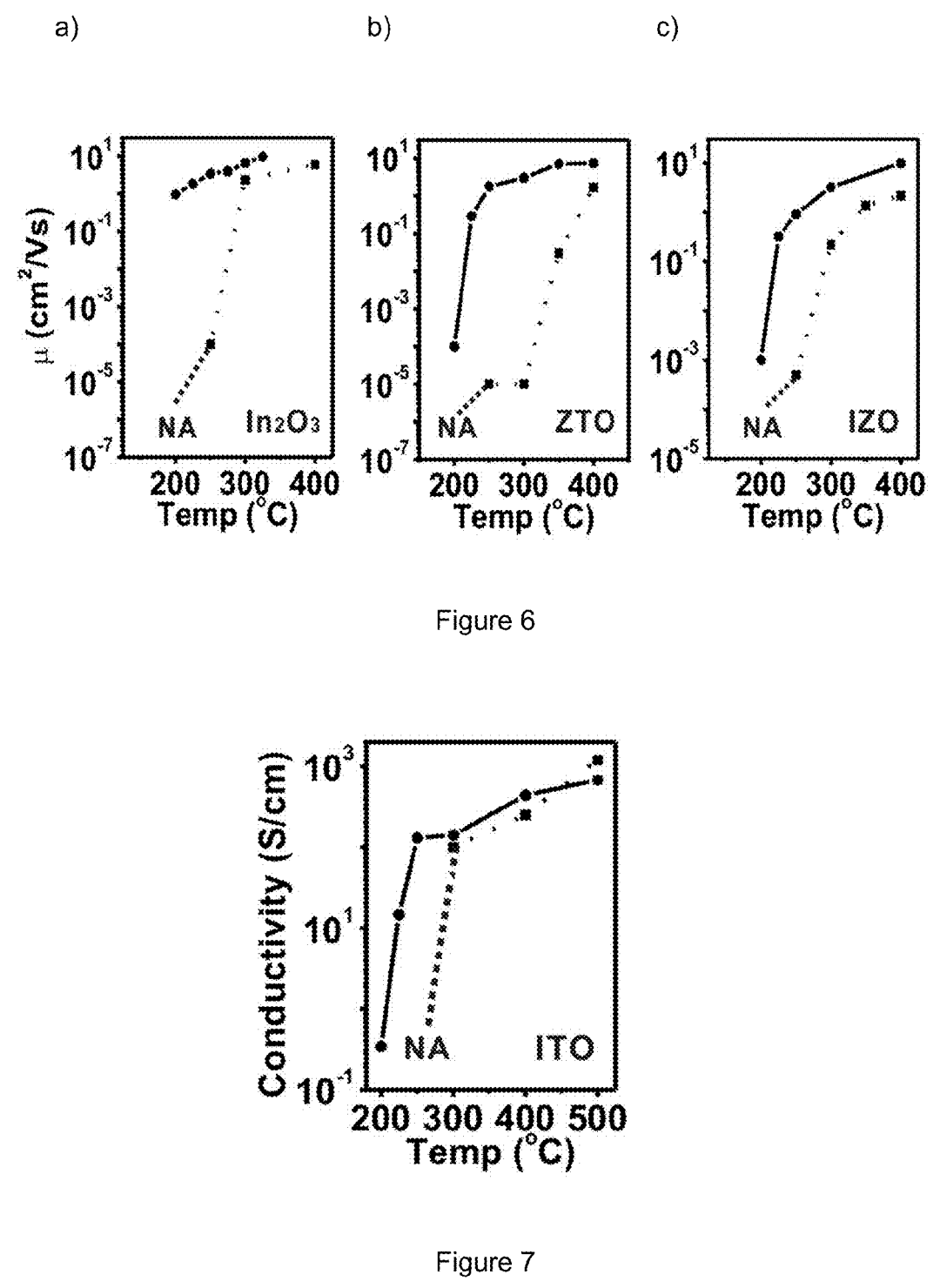

FIG. 7 compares the conductivities of ITO films derived from combustion precursors (circle symbols) versus conventional precursors (square symbols) fabricated at different annealing temperatures.

Figure 8:
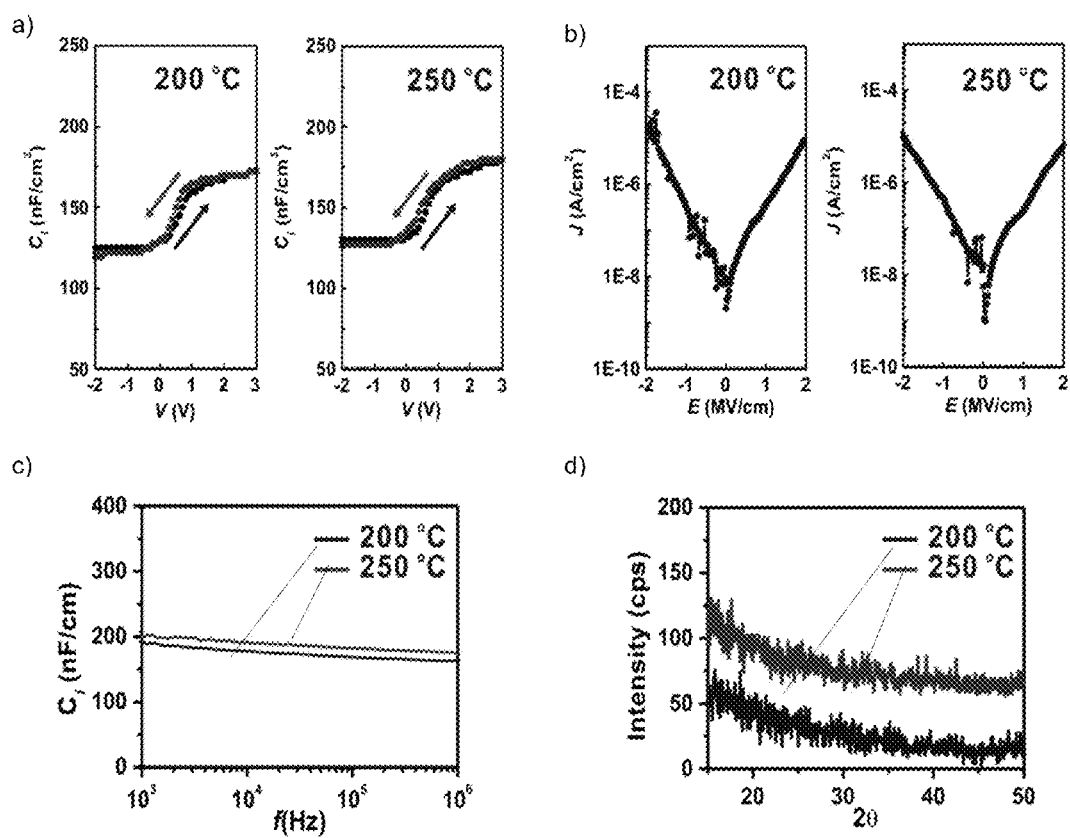

FIG. 8 provides characterization data of amorphous alumina films annealed at 200° C. and 250° C.: (a) C-V measurements at 10 kHz; (b) leakage current measurements; (c) frequency dependence measurements at 3V; and (d) GIAXRD spectra.

FIGS. 9a-d show representative transfer and output plots of combustion precursor-derived TFTs with 2000 µm channel width, 100 µm channel length, Al electrodes: (a) transfer plots of combustion precursor-derived $In_2O_3$, ZTO, and IZO TFT devices annealed at 250° C. on 300 nm $SiO_2$/p+Si substrates; (b) transfer plots of a representative combustion precursor-derived $In_2O_3$ TFT device on n++Si/α-alumina dielectric (38 nm α-alumina annealed at 250° C., 41 nm α-alumina annealed at 200° C.); and (c) representative transfer plot and (d) representative output plot of an all-oxide TFT ($In_2O_3$/38 nm α-alumina/250 nm ITO/1737 F glass) annealed at 250° C.

Figure 10:
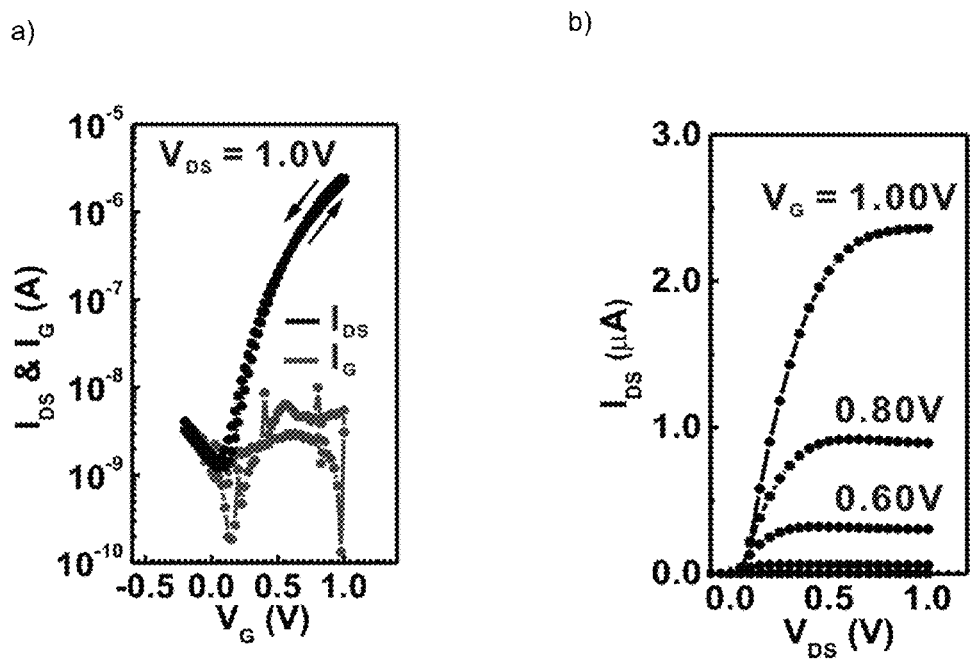

FIGS. 10a-b show the (a) transfer plot and (b) output plot of a representative flexible combustion precursor-derived metal oxide TFT device ($In_2O_3$/41 nm α-alumina dielectric/30 nm Al gate electrode/30 nm AryLite™ substrate).

Figure 11:
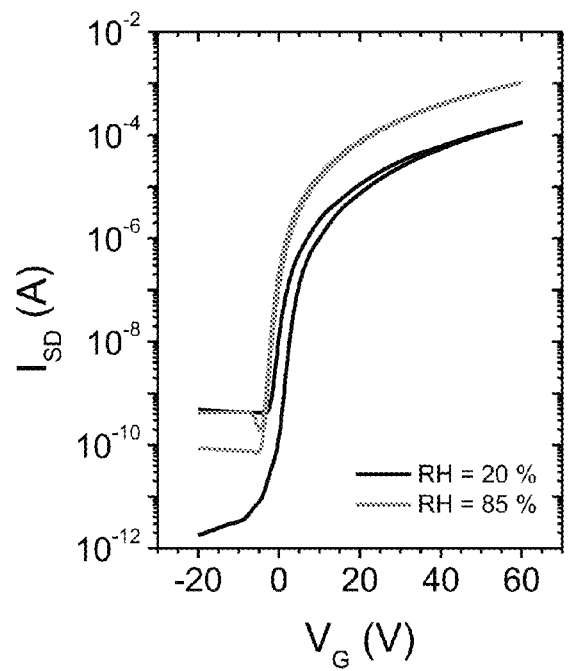

FIG. 11 shows representative transfer plots of combustion precursor-derived IGZO TFT devices annealed at different relative humidities.

FIGS. 12a-c show representative transfer and output plots for ZnO-based TFTs having the structure Si/300 nm $SiO_2$/ZnO/100 nm Al (L=100 µm, W=5000 µm): (a) transfer plots for ZnO nanorod-based (circle symbols) and nanocomposite-based (square symbols) TFTs; (b) output plot for a representative ZnO nanocomposite-based TFT; and (c) output plot for a representative ZnO nanorod-based TFT.

FIGS. 13a-b compare the conductivities of nanoparticle-based versus nanocomposite-based ITO thin films (a) without and (b) with $H_2$ treatment measured under air as a function of the processing temperature.

Figure 14:
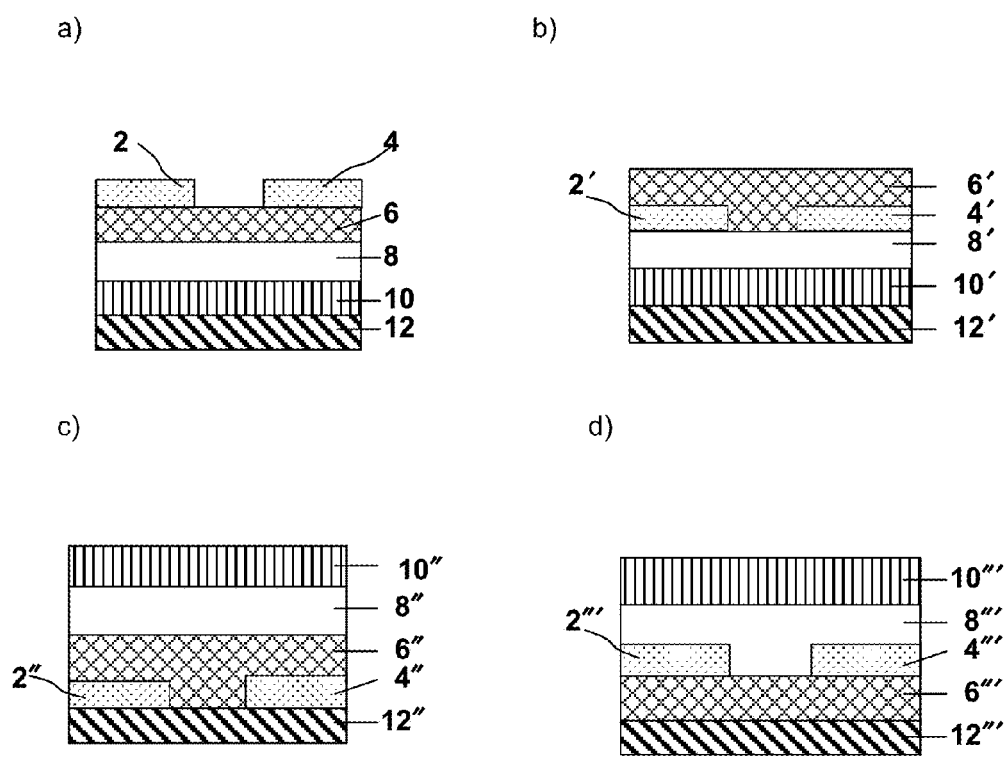

FIG. 14 illustrates four different configurations of thin film transistors.

Figure 15:
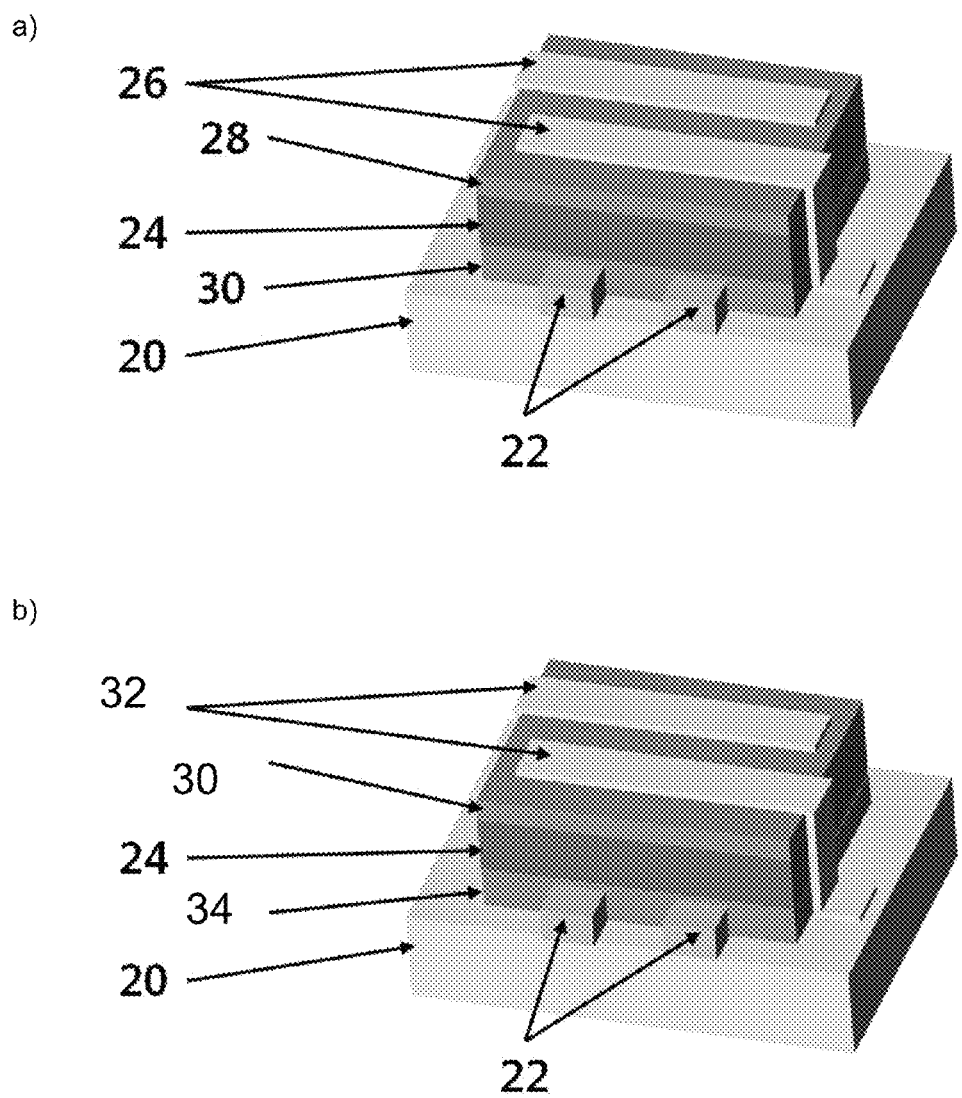

FIG. 15 illustrates two different configurations of bulk-heterojunction thin film photovoltaic devices (also known as solar cells).

DETAILED DESCRIPTION

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

The present teachings, in part, provide a method of preparing a metal oxide thin film which, when used as an electrically transporting or insulating component in a semiconductor device, can provide various advantages. For example, depending on the composition of the metal oxide, the metal oxide thin film can be used as one or more of the semiconductor components, one or more of the dielectric components, or one or more of the conductor components in a semiconductor device. In certain embodiments, the present method can be used to prepare multiple metal oxide thin films of different compositions, where the metal oxide thin films of different compositions can be used as different components in a semiconductor device. In particular embodiments, the present method can be used to fabricate a transistor which includes a semiconductor component, a dielectric component, and conductor components, where at least one of these components, at least two of these components, or each of these components can be composed of a metal oxide thin film prepared according to the present methods. In other embodiments, the present method can be used to fabricate a photovoltaic cell which includes a semiconductor component, at least one of the conductor components, and/or at least one of the interlayer components that is composed of a metal oxide thin film prepared according to the present methods.

Accordingly, in one aspect, the present teachings can be directed to a method of preparing a metal oxide thin film for use as an electrically transporting component (e.g., a semiconductor component or a conductor component) or an electrically insulating component (e.g., a dielectric component) in a semiconductor device. The method generally includes depositing a thin film from a precursor composition as described herein, and annealing the thin film at a temperature less than or about 350° C. to form a metal oxide thin film. While various precursors have been used in existing solution-phase methods for processing metal oxide thin films, conventional precursors (e.g., a sol-gel system including a metal source, a base catalyst, a stabilizer, and a solvent as described above) typically require high temperatures 400° C.) to complete the condensation of the precursor sol, the removal of the organic stabilizer within the thin film, and finally, full densification of the metal oxide thin films. Such high-temperature requirements by any of these steps can risk complications such as film cracking induced by thermal expansion coefficient mismatch. Further, such high processing temperature requirements make these methods incompatible with most conventional flexible plastic substrates. Even in limited cases where the processing temperatures can be lowered, the reported mobilities achieved by the resulting metal oxide thin film semiconductor are limited (~1 $cm^2$/Vs).

By comparison, the precursor compositions according to the present teachings include a redox pair of precursors (a fuel and an oxidizing agent) that are chosen and provided under conditions to induce a combustion reaction. Specifically, the precursors are selected and provided at amounts such that the fuel and the oxidizing agent react in a series of reactions, over the course of which heat is generated, and the fuel is oxidized by the oxidizing agent and mostly converted into gases such as $CO_2$, $H_2O$, and $N_2$. The self-generated heat from the precursors' reaction provides a localized energy supply, thereby eliminating the need for high, externally applied processing temperatures. Thus, the temperature requirement of the annealing step can be lowered generally to less than about 400° C., preferably about 350° C. or less, about 300° C. or less, about 250° C. or less, about 200° C. or less, or as low as about 150° C. Despite the use of lower annealing temperatures, the choice of the precursors and the combustion reactions they enable result in metal oxide thin films with desirable microstructural and molecular features, which confer satisfactory electronic properties for the films to be useful as electrically transporting or insulating components in semiconductor devices. For example, when incorporated into a thin film transistor, a metal oxide semiconductor prepared by the present method can exhibit enhanced field effect characteristics such as increased field effect mobilities (e.g., >1 $cm^2$/Vs). Specifically, as demonstrated by the examples hereinbelow, mobilities as high as ~40 $cm^2$/Vs were achieved by transistor devices implementing the present metal oxide thin films as the semiconductor, where the annealing temperature was only about 250° C. Even with an annealing temperature as low as about 200° C., mobilities over 10 $cm^2$/Vs were achieved. Similarly, a conductivity greater than about 100 S/cm was obtained with transparent conducting metal oxide thin films prepared by the present methods at an annealing temperature of only about 250° C. Thus, the low processing temperatures according to the present teachings can enable fabrication of high-performance devices on conventional flexible plastic substrates that have a low heat-resistance.

Accordingly, in one aspect, the present teachings relate to precursor compositions that can be used to prepare various metal oxide thin films via solution-phase processes including various thin film metal oxide semiconductors, thin film metal oxide conductors, and thin film metal oxide dielectrics. Exemplary semiconducting metal oxides include indium oxide ($In_2O_3$), indium zinc oxide (IZO), zinc tin oxide (ZTO), indium gallium oxide (IGO), indium-gallium-zinc oxide (IGZO), tin oxide ($SnO_2$), nickel oxide (NiO), copper oxide ($Cu_2O$), and zinc oxide (ZnO). These semiconducting films can have dopants (such as fluorine, sulfur, lithium, rhodium, silver, cadmium, scandium, sodium, calcium, magnesium, barium, and lanthanum) to improve electron (for n-type) or hole (for p-type) mobility and/or conductivity. Exemplary insulating metal oxides include alumina ($Al_2O_3$), cerium oxide ($CeO_x$), yttrium oxide ($Y_2O_3$), titanium oxide ($TiO_2$), zirconium oxide ($ZrO_2$), hafnium oxide ($HfO_2$), tantalum oxide ($Ta_2O_5$), and barium and strontium titanium oxide (($Ba,Sr)TiO_3$). Exemplary conducting metal oxides include transparent conducting oxides such as indium tin oxide (ITO, or tin-doped indium oxide Sn—In—O where the Sn content is about 10% or less), indium-doped zinc oxide (IZO), zinc indium tin oxide (ZITO), gallium-doped zinc oxide (GZO), gallium-doped indium oxide (GIO), fluorine-doped tin oxide (FTO), gallium indium tin oxide (GITO), and aluminum-doped zinc oxide (AZO).

A precursor composition according to the present teachings generally includes a fuel and one or more oxidizing agents in a solvent or solvent mixture, wherein the fuel and/or at least one of the oxidizing agent(s) comprise a metal reagent, and wherein the fuel and the one or more oxidizing agents are provided under conditions that would favor combustion reactions. Generally, the fuel and the one or more oxidizing agents are present in substantially stoichiometric amounts to allow formation of the desired metal oxide and complete combustion of the remaining reagents (that is, the stoichiometric ratio should be calculated based on the ideal oxidation of all components). Despite the fact that some variations from the stoichiometric amounts are acceptable, when the precursor composition includes either too much oxidant (e.g., more than ten times exceeding the stoichiometric amount) or too much fuel (e.g., more than ten times exceeding the stoichiometric amount), combustion reactions can be disfavored and such precursor compositions may not allow metal oxide thin films to be formed under the favorable thermodynamics according to combustion chemistry, which may lead to a high level of impurities, poor film morphology, and/or poor electrical connections within the metal-O-metal lattice. In addition, while conventional metal oxide precursor compositions typically include at least one metal alkoxide, the present precursor composition does not include any alkoxide as a metal source.

Different embodiments of the redox pair of precursors according to the present teachings are possible. In certain embodiments, the present precursor composition can include one or more metal reagents, an organic fuel, and optionally an inorganic reagent, wherein the organic fuel forms a redox pair with at least one of the metal reagents or the inorganic reagent; that is, at least one of the metal reagents or the inorganic reagent comprises an oxidizing anion which can react with the organic fuel (an organic compound) in a combustion reaction to produce $CO_2$, $H_2O$, and optionally $N_2$ and/or other gases depending on the composition of the fuel. In other embodiments, the present precursor composition can include a fuel and an oxidizing agent, wherein the fuel can be in the form of a first metal reagent (i.e., the fuel can take the form of an anion) and the oxidizing agent can be in the form of a second metal reagent (i.e., the second metal reagent can include an oxidizing anion). In yet other embodiments, the fuel can be in the form of a first metal reagent (i.e., the fuel can take the form of an anion), and the oxidizing agent can be an acid or an inorganic reagent comprising an oxidizing anion. In various embodiments, the present precursor composition can include a base, typically, $NH_3$. In various embodiments, the base can be introduced into the precursor composition after the fuel and the oxidizing reagent have dissolved completely in the solvent or solvent mixture.

Examples of oxidizing anions include, but are not limited to, nitrates, nitrites, perchlorates, chlorates, hypochlorites, azides, N-oxides ($R^3N^+$—$O^-$), peroxides, superoxides, high-valent oxides, persulfates, dinitramides, nitrocyanamides, nitroarylcarboxylates, tetrazolates, and hydrates thereof. As described above, in some embodiments, the oxidizing agent can be in the form of an acid, in which case, the acid can be a corresponding acid of one of the oxidizing anions described herein (e.g., nitric acid). For example, the oxidizing agent can be in the form of an acid in embodiments where the fuel is a metal reagent including a fuel anion.

The fuel in the present precursor compositions generally can be described as a compound or anion capable of being oxidized by the oxidizing agent and releasing energy (i.e., heat) by the process of oxidation. This fuel component can be decomposed into one or more intermediates such as $COO^-$, $CO$, $CH_4$, $CH_3O^-$, $NH_2NHOH$, $NH_3$, $N_2H_3^-$, $N_2H_4$, and $N_2H_5^+$, before conversion into $CO_2$, $H_2O$, and optionally, $N_2$. When the fuel is an organic compound, the organic fuel can be composed of carbon, oxygen, and hydrogen, and in some embodiments, also nitrogen. Other elements can be present in the fuel such as fluorine, sulfur, and phosphorus. Typically, the organic fuel is a relatively low molecular weight compound. For example, the organic fuel can have a molar mass of about 200 g/mol or less. Examples of organic fuel that can be used as one of the precursors according to the present methods include, without limitation, acetylacetone ($CH_3COCH_2COCH_3$), fluorinated derivatives of acetylacetone (e.g., $CF_3COCH_2COCF_3$ or $CH_3COCHFCOCH_3$), imine derivatives of acetylacetone (e.g., $CH_3COCH_2C(=NR)CF_3$ or $CH_3C(=NR)CHFC(=NR)CH_3$), phosphine derivatives of acetylacetone (e.g., $Ph_2POCH_2COCH_3$), urea ($CO(NH_2)_2$), thiourea ($CS(NH_2)_2$), glycine ($C_2H_5NO_2$), alanine ($C_3H_7NO_2$), N-methylurea ($CH_3NHCONH_2$), citric acid ($HOC(COOH)(CH_2COOH)_2$), stearic acid ($CH_3(CH_2)_{16}COOH$), ascorbic acid, ammonium bicarbonate ($NH_4HCO_3$), nitromethane, ammonium carbonate (($NH_4)_2CO_3$), hydrazine ($N_2H_4$), carbohydrazide ($CO(N_2H_3)_2$), oxalyl dihydrazide, malonic acid dihydrazide, tetra formal tris azine (TFTA), hexamethylenetetramine ($C_6H_{12}N_4$), malonic anhydride ($OCH(CH_2)CHO$), as well as diamines, diols, or dioic acids having an internal alkyl chain of 6 carbon atoms or less. In embodiments where the fuel component also acts as the metal source, the corresponding ester of the carboxylic acids or anhydrides described herein can be used instead. To illustrate, examples of fuel anions can include, without limitation, acetylacetonates (including fluorinated, imine or phosphine derivatives thereof), oxalates, citrates, ascorbates, stearates, and so forth. Various metal acetylacetonates are commercially available including aluminum (III) acetylacetonate, zinc (II) acetylacetonate, and zirconium (IV) acetylacetonate. Indium (III) acetylacetonate, gallium (III) acetylacetonate, and tin(II) acetylacetonate are known in the literature, as well as various metal oxalates, metal citrates, metal ascorbates, and metal stearates.

Depending on the composition of the desired metal oxides, one or more metal reagents can be present in the precursor composition. Each metal reagent can include a metal selected from a transition metal (any Group 3 to Group 11 metal), a Group 12 metal, a Group 13 metal, a Group 14 metal, a Group 15 metal, and a lanthanide. In certain embodiments, the present precursor composition can include a metal reagent having a metal selected from a Group 13 metal, a Group 14 metal, a Group 15 metal, and a lanthanide. In particular embodiments, the present precursor composition can include at least a Group 13 metal reagent, for example, an indium (In) reagent and/or a gallium reagent (Ga) for preparing an electrically transporting metal oxide such as $In_2O_3$, IZO, IGO, IGZO, or ITO. In particular embodiments, the present precursor composition can include a Group 13 metal (such as aluminum (Al)) and/or a lanthanide (such as lanthanum (La) or cerium (Ce)) for preparing an insulating metal oxide such as $Al_2O_3$, $CeO_x$, $La_2O_3$ or $LaAlO_3$.

To illustrate, the precursor composition according to the present teachings can be used to prepare an indium-containing metal oxide, for example, $In_2O_3$, IZO, IGO, IGZO, or ITO. Accordingly, in some embodiments, a precursor composition that can be used to prepare the indium-containing metal oxide thin film according to the present teachings can include an organic fuel selected from acetylacetone (including fluorinated, imine, or phosphine derivatives thereof), urea, N-methylurea, citric acid, stearic acid, ascorbic acid, hydrazine, carbohydrazide, oxalyl dihydrazide, malonic acid dihydrazide, and malonic anhydride; and an indium salt comprising an oxidizing anion selected from a nitrate, a nitrite, a perchlorate, a chlorate, a hypochlorite, an azide, an N-oxide, a peroxide, a superoxide, a high-valent oxide, a persulfate, a dinitramide, a nitrocyanamide, a nitroarylcarboxylate, a tetrazolate, and hydrates thereof. For example, the precursor composition can include $In(NO_3)_3$ or a hydrate thereof, and an organic fuel such as acetylacetonate, $CF_3COCH_2COCF_3$, $CH_3COCHFCOCH_3$, $CH_3COCH_2C(=NR)CF_3$, $CH_3C(=NR)CHFC(=NR)CH_3$, $Ph_2POCH_2COCH_3$, or urea. In other embodiments, an indium-containing metal oxide thin film can be prepared according to the present teachings using a precursor composition that can include an indium salt including a fuel anion selected from an acetylacetonate, an oxalate, a citrate, an ascorbate, and a stearate; and an oxidizing agent that is either an acid or an inorganic reagent including an oxidizing anion selected from a nitrate, a nitrite, a perchlorate, a chlorate, a hypochlorite, an azide, an N-oxide, a peroxide, a superoxide, a high-valent oxide, a persulfate, a dinitramide, a nitrocyanamide, a nitroarylcarboxylate, a tetrazolate, and hydrates thereof. For example, the precursor composition can include indium acetylacetonate as the fuel and either nitric acid ($HNO_3$) or $NH_4NO_3$ as the oxidizing agent. In yet other embodiments, an indium-containing metal oxide thin film can be prepared according to the present teachings using a precursor composition that can include a first indium salt including an oxidizing anion selected from a nitrate, a nitrite, a perchlorate, a chlorate, a hypochlorite, an azide, an N-oxide, a peroxide, a superoxide, a high-valent oxide, a persulfate, a dinitramide, a nitrocyanamide, a nitroarylcarboxylate, a tetrazolate, and hydrates thereof; and a second indium salt including a fuel anion selected from an acetylacetonate (including fluorinated, imine, or phosphine derivatives thereof), an oxalate, a citrate, an ascorbate, and a stearate. In any of these embodiments, the precursor composition can include $NH_3$.

When mixed oxides (e.g., ternary or quaterny oxides) are desired, the additional metal reagent(s) can comprise any anion that would confer satisfactory solubility to the metal reagent(s) in the solvent or solvent mixture of the precursor composition. Accordingly, the additional metal reagent(s) independently can comprise an oxidizing anion, a fuel anion, or a non-oxidizing anion. Examples of non-oxidizing anions include, but are not limited to, halides (e.g., chlorides, bromides, iodides), carbonates, acetates, formates, propionates, sulfites, sulfates, hydroxides, alkoxides, trifluoroacetates, trifluoromethanesulfonates, tosylates, mesylates, and hydrates thereof. In embodiments where a desired metal is not chemically stable as an oxidizing salt and/or it is not readily available as a salt comprising a fuel anion as described herein, an inorganic reagent comprising an oxidizing anion or a fuel anion can be used. For example, an inorganic reagent that can be used as an oxidizing agent can be selected from ammonium nitrate, ammonium dinitramide, ammonium nitrocyanamide, and ammonium perchlorate. Examples of inorganic reagents that can be used as a fuel can include, without limitation, ammonium acetylacetonate, ammonium oxalate, ammonium ascorbate, ammonium citrate, and ammonium stearate.

In certain embodiments, the present precursor composition can include a first metal salt and a second metal salt, wherein the first metal salt comprises a fuel and the second metal salt comprises an oxidizing anion. For example, the present precursor composition can include a redox pair including a metal nitrate and a metal acetylacetonate. Various metal acetylacetonates are commercially available including aluminum (III) acetylacetonate, zinc (II) acetylacetonate, and zirconium (IV) acetylacetonate. Indium (III) acetylacetonate, gallium (III) acetylacetonate, and tin(II) acetylacetonate are known in the literature. Other examples of metal salts that can function as a fuel include, but are not limited to, metal oxalates, metal citrates, metal ascorbates, metal stearates, and so forth.

The concentration of metal reagents in the precursor composition can be between about 0.01 M and about 5.0 M. For example, the metal reagent can have a concentration between about 0.02 M and about 2.0 M, between about 0.05 M and about 1.0 M, between about 0.05 M and about 0.5 M, or between about 0.05 M and about 0.25 M. In embodiments in which the precursor composition includes two or more metal reagents, the relative ratio of the metal reagents can vary, but typically ranges from 1 to 10.

The solvent or solvent mixture can include water and/or one or more organic solvents. For example, the solvent can be selected from water, an alcohol, an aminoalcohol, a carboxylic acid, a glycol, a hydroxyester, an aminoester, and a mixture thereof. In some embodiments, the solvent can be selected from water, methanol, ethanol, propanol, butanol, pentanol, hexyl alcohol, heptyl alcohol, ethyleneglycol, methoxyethanol, ethoxyethanol, methoxypropanol, ethoxypropanol, methoxybutanol, dimethoxyglycol, N,N-dimethylformamide, and mixtures thereof. In particular embodiments, the solvent can be an alkoxyalcohol such as methoxyethanol, ethoxyethanol, methoxypropanol, ethoxypropanol, or methoxybutanol.

In some embodiments, the precursor composition can further include one or more additives selected from detergents, dispersants, binding agents, compatibilizing agents, curing agents, initiators, humectants, antifoaming agents, wetting agents, pH modifiers, biocides, and bactereriostats. For example, surfactants, chelates (e.g., ethylenediaminetetraacetic acid (EDTA)), and/or other polymers (e.g., polystyrene, polyethylene, poly-alpha-methylstyrene, polyisobutene, polypropylene, polymethylmethacrylate and the like) can be included as a dispersant, a binding agent, a compatibilizing agent, and/or an antifoaming agent.

As demonstrated by the examples herein, metal oxide synthesis using combustion chemistry between a fuel and an oxidizing agent offers many advantages for film solution processing. First, the availability of high local temperatures without a furnace enables low-cost large-scale thin-film syntheses, and the high self-generated energies can convert the precursors into the corresponding oxides at low process temperatures. In contrast, oxide formation via conventional precursors based on sol-gel chemistry conversion is endothermic, and requires significant external energy input to form metal-O-metal lattices, whereas combustion synthesis is exothermic and does not require external energy input once ignited. Furthermore, conventional precursors typically require high temperatures for decomposing the organic stabilizer to achieve phase-pure products, while in combustion reactions with balanced redox chemistry, the atomically local oxidizer supply can remove organic impurities efficiently without coke formation.

In various embodiments, the precursor composition can be aged for at least about 3 hours, for at least about 6 hours, for at least about 9 hours, for at least about 12 hours, or for at least about 18 hours, before the film deposition step. The depositing step can be carried out by various solution-phase methods. For example, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin-coating, slot-coating, drop-casting, zone casting, dip coating, blade coating, spray-coating, rod coating, or stamping.

The typical atmosphere to carry out the deposition step and/or the annealing step is ambient air; however, other conditions are possible including air with controlled humidity level, oxygen-enriched atmospheres, nitrogen-enriched atmospheres, pure oxygen, pure nitrogen, or pure hydrogen. In certain embodiments, the deposition step and the annealing step can be carried out in different atmospheres; for example, both steps can be carried out under ambient air but each of the steps can be performed under ambient air with different relative humidity levels. In certain embodiments, the annealing step can be performed under an oxygen-containing atmosphere with low humidity to enhance the combustion reaction. During the annealing step, the solvent is eliminated, and the oxidizing metal reagent and the fuel (or the metal salt comprising the fuel and the oxidizing agent) react to form a metal-O-metal lattice. Also, organic impurities within the thin film are removed. As described above, the combustion chemistry enabled by the present precursor compositions allows the annealing temperature to be lowered to less than or about 350° C. In various embodiments, the annealing step can be carried out at a temperature of less than or about 325° C., less than or about 300° C., less than or about 275° C., less than or about 250° C., less than or about 225° C., less than or about 200° C., less than or about 180° C., or as low as about 150° C. More generally, the annealing step can be performed at a temperature lower than the dehydration temperature of the desired metal oxide. Table 1 provides the reported dehydration temperature of various metal oxides.

TABLE 1

| Metal Hydroxide | | |
| --- | --- | --- |
| $Mg(OH)_2$ | MgO (300° C.) | |
| $Al(OH)_3$ | AlOOH (300° C.) | $Al_2O_3$ (500° C.) |
| $Si(OH)_4$ | a-$SiO_2$ (600° C.) | |
| $Zn(OH)_2$ | ZnO (155° C.) | |
| $Ga(OH)_3$ | $Ga_2O_3$ (420-500° C.) | |
| $Cd(OH)_2$ | CdO (360° C.) | |
| $In(OH)_3$ | $In_2O_3$ (270-330° C.) | |
| $Sn(OH)_4$ | $SnO_2$ (290° C.) | |
| $Pb(OH)_2$ | PbO ($T_{dehyd}$ <100° C.) | |
| $Y(OH)_3$ | YOOH (250° C.) | $Y_2O_3$ (400° C.) |
| $H_2Ti_2O_4(OH)_2$ | $TiO_2$ (400° C.) | |
| $ZrO_x(OH)_{4-2x}$ | a-$ZrO_2$ (~200-400° C.) | |
| $Ni(OH)_2$ | NiO (300° C.) | |
| $Cu(OH)_2$ | CuO ($T_{dehyd}$ <120° C.) | |
| $Ce(OH)_4$ | $CeO_2$ ($T_{dehyd}$ <200° C.) | |

For example, the annealing step can be performed at a temperature at least 25° C., at least 50° C., or at least 70° C. lower than the dehydration temperature of the metal oxide. The annealing step can be carried out by various methods known in the art, for example, by using resistive elements (e.g., ovens), IR radiation (e.g., IR lamps), microwave radiation (e.g., microwave ovens), and/or magnetic heating, for a duration as short as about 5 seconds and up to about an hour or longer for each annealing cycle. As discussed below and demonstrated elsewhere herein, the reduction of annealing temperatures can be used to achieve metal oxides with good surface morphologies, microstructural features, and electronic properties.

In particular, because metal oxide thin film electronic materials (regardless of their use as semiconductors, dielectrics, and conductors) require good surface morphologies to achieve optimal performance, the thickness of the thin film provided by each deposition step should be less than or about 50 nm. In most embodiments, the thickness of the thin film provided by each deposition step should be less than or about 40 nm, less than or about 30 nm, less than or about 25 nm, less than or about 20 nm, less than or about 15 nm, less than or about 10 nm, or less than or about 5 nm. Thicker films up to about 100 nm can be achieved by multiple deposition steps. Specifically, in between each deposition step, the thin film is annealed to achieve full densification before a new thin film is deposited. Thinner sublayers (e.g., <20 nm) generally can favor the formation of amorphous metal oxides; while thicker films (obtained either by a single deposition cycle or multiple deposition cycles) can favor the formation of crystalline metal oxides. Thicker films (e.g., >100 nm), especially those obtained with each sublayer having a thickness of greater than about 50 nm, also tend to have a high porosity, which can be useful in certain applications but undesirable as transistor components.

The present methods can be used to prepare metal oxides of various compositions, including binary oxides and mixed oxides such as ternary oxides. In various embodiments, the metal oxide can include at least one Group 13 metal, at least one Group 14 metal, and/or at least one lanthanide. In certain embodiments, the present methods can be used to prepare a thin film semiconductor comprising an amorphous metal oxide, particularly, an amorphous ternary or quaternary metal oxide. For example, the amorphous metal oxide thin film semiconductor can be selected from $\alpha$-IZO, $\alpha$-ZTO, $\alpha$-IGO, and $\alpha$-IGZO. In certain embodiments, the present methods can be used to prepare a thin film dielectric comprising an amorphous metal oxide. For example, the amorphous metal oxide can be $\alpha$-alumina or $\alpha$-CeO$_2$. In certain embodiments, the present methods can be used to prepare a thin film conductor comprising a ternary metal oxide selected from ITO and AZO.

Accordingly, in various embodiments, the present method typically involves (a) depositing a thin film from a precursor composition as described herein; (b) annealing the thin film at a temperature less than or about 350° C. to form a metal oxide thin film; and carrying out steps (a) and (b) one or more times by depositing a new thin film on any previously deposited and annealed thin film, where each thin film formed by a single cycle of steps (a) and (b) has a thickness of less than or about 50 nm.

The metal oxide thin film fabricated according to the present teachings can be used in various types of semiconductor devices. For example, the present metal oxide thin films can be used as transparent conducting metal oxides in light-emitting devices; electrodes or interfacial layers (e.g., hole-transport layer (HTL) or electron-transport layer (ETL)) in (bulk-heterojunction (BHJ-OPV) or dye-sensitized (DSSC)) photovoltaic devices; and semiconductors, dielectrics, and/or conductors in thin film transistors.

Accordingly, in one aspect, the present teachings can relate to a method of fabricating a thin film transistor. The thin film transistor can have different configurations, for example, a top-gate top-contact structure, top-gate bottom-contact structure, a bottom-gate top-contact structure, or a bottom-gate bottom-contact structure. A thin film transistor generally includes a substrate, electrical conductors (source, drain, and gate conductors), a dielectric component coupled to the gate conductor, and a semiconductor component coupled to the dielectric on one side and in contact with the source and drain conductors on the other side. As used herein, "coupled" can mean the simple physical adherence of two materials without forming any chemical bonds (e.g., by adsorption), as well as the formation of chemical bonds (e.g., ionic or covalent bonds) between two or more components and/or chemical moieties, atoms, or molecules thereof.

The present methods of fabricating a thin film transistor can include coupling the thin film semiconductor to the thin film dielectric; and coupling the thin film dielectric to the thin film gate electrode. The thin film semiconductor can be coupled to the thin film dielectric by contacting the thin film dielectric with a semiconductor precursor composition, wherein the semiconductor precursor composition can include a fuel and one or more oxidizing agents in a solvent or solvent mixture, wherein the fuel and/or at least one of the oxidizing agent(s) comprise a metal reagent, and wherein the fuel and the one or more oxidizing agents are present in substantially stoichiometric amounts to allow metal oxide formation and complete combustion. For example, the semiconductor precursor composition can include at least one oxidizing metal reagent and a fuel selected from acetylacetone (including fluorinated, imine, or phosphine derivatives thereof), urea, N-methylurea, hydrazine, malonic anhydride, and a metal acetylacetonate. In certain embodiments, the semiconductor precursor composition can include two or more metal reagents, wherein at least one of the metal reagents comprises an oxidizing anion and at least one of the metal reagents comprises a metal selected from a lanthanide, a Group 13 metal, and a Group 14 metal. The semiconductor precursor composition now in contact with the thin film dielectric then can be annealed to a temperature of less than or about 350° C. to provide a metal oxide thin film semiconductor having a thickness of less than or about 50 nm. Following the annealing step, a new cycle including the contacting step and the annealing step can be repeated one or more times to increase the thickness of the final metal oxide thin film semiconductor.

The thin film dielectric can be composed of inorganic (e.g., oxides such as $SiO_2$, $Al_2O_3$, or $HfO_2$; and nitrides such as $Si_3N_4$), organic (e.g., polymers such as polycarbonate, polyester, polystyrene, polyhaloethylene, polyacrylate), or hybrid organic/inorganic materials. The thin film dielectric can be coupled to the thin film gate electrode by various methods known in the art, including the growth of self-assembled nanodielectric materials such as those described in Yoon et al., *PNAS*, 102 (13): 4678-4682 (2005), and Ha et al., *Chem. Mater.*, 21(7): 1173-1175 (2009); and solution-processable inorganic/organic hybrid materials as described in Ha et al., *J. Am. Chem. Soc.*, 132 (49): 17428-17434 (2010), the entire disclosure of each of which is incorporated by reference herein. In various embodiments, the thin film dielectric material in contact with a metal oxide thin film semiconductor prepared according to the present teachings can have a high dielectric constant. For example, the thin film dielectric material can have a dielectric constant that ranges from about 4 to about 30. Furthermore, the dielectric material can be in the form of a bilayer, where one layer is composed of an electrically insulating organic layer which is in contact with the metal oxide semiconductor layer according to the present teachings and a second electrically insulating metal oxide layer which can be deposited by solution processing or vapor deposition such as sputtering. In such embodiments, the organic layer can have a dielectric constant between about 2 and about 4, and the oxide layer can have a dielectric constant between about 4 and about 30.

In certain embodiments, the thin film dielectric can be a metal oxide thin film prepared according to the present methods (including a nanomaterial-derived metal oxide thin film as described below). As demonstrated in the examples hereinbelow, the implementation of a low-temperature amorphous metal oxide thin film dielectric with a metal oxide thin film semiconductor prepared by the present methods can lead to much improved semiconductor-dielectric interface, which can enhance the transistor performance significantly. Accordingly, in certain embodiments, the thin film gate electrode can be contacted with a dielectric precursor composition, where the dielectric precursor composition can include a fuel and one or more oxidizing agents in a solvent or solvent mixture, wherein the fuel and/or at least one of the oxidizing agent(s) comprise a metal reagent, and wherein the fuel and the one or more oxidizing agents are present in substantially stoichiometric amounts to allow metal oxide formation and complete combustion. For example, the dielectric precursor composition can include at least one metal reagent and an organic fuel in a solvent or solvent mixture, wherein the metal reagent and the organic fuel form a redox pair. In particular embodiments, the metal reagent can comprise aluminum or cerium. The dielectric precursor composition now in contact with the thin film gate electrode then can be annealed to a temperature of less than or about 350° C. to provide a metal oxide thin film dielectric having a thickness of less than or about 50 nm. Following the annealing step, a new cycle including the contacting step and the annealing step can be repeated one or more times to increase the thickness of the final metal oxide thin film dielectric.

The gate electrode and the other electrical contacts (source and drain electrodes) independently can be composed of metals (e.g., Au, Ag, Al, Ni, Cu), transparent conducting oxides (e.g., ITO, FTO, IZO, ZITO, GZO, GIO, GITO), or conducting polymers (e.g., poly(3,4-ethylenedioxythiophene) poly (styrenesulfonate) (PEDOT:PSS), polyaniline (PANI), or polypyrrole (PPy)). In certain embodiments, the gate electrode (and/or source and drain electrodes) of the thin film transistor can be a metal oxide thin film (e.g., a transparent conducting oxide such as ITO, IZO, ZITO, GZO, GIO, or GITO) prepared according to the present methods (including a nanomaterial-derived metal oxide thin film as described below). Accordingly, in certain embodiments, the method can include coupling the thin film gate electrode to a substrate by contacting the substrate with a conductor precursor composition, where the conductor precursor composition can include a fuel and one or more oxidizing agents in a solvent or solvent mixture, wherein the fuel and/or at least one of the oxidizing agent(s) comprise a metal salt, and wherein the fuel and the one or more oxidizing agents are present in substantially stoichiometric amounts to allow metal oxide formation and complete combustion. In certain embodiments, the conductor precursor composition can include at least two metal reagents and a fuel selected from acetylacetone (including fluorinated, imine, or phosphine derivatives thereof), urea, N-methylurea, hydrazine, malonic anhydride, and a metal acetylacetonate. The conductor precursor composition now in contact with the substrate then can be annealed to a temperature of less than or about 350° C. to provide a metal oxide thin film conductor. Following the annealing step, a new cycle including the contacting step and the annealing step can be repeated one or more times to increase the thickness of the final metal oxide thin film gate electrode. As described above, any of the annealing steps of the present methods (whether to anneal the semiconductor precursor composition, the dielectric precursor composition, and/or the conductor precursor composition) can include exposure to a radiation source.

The substrate component can be selected from doped silicon, glass, aluminum or other metals alone or coated on a polymer or other substrate, a doped polythiophene, as well as polyimide or other plastics including various flexible plastics. In particular embodiments, the substrate can be a low heat-resistant flexible plastic substrate with which prior art conventional precursors for processing oxide thin films are incompatible. Examples of such flexible substrates include polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof. In particular embodiments, the substrate can be an inexpensive rigid substrate that has relatively low heat and/or chemical resistance. For example, the present metal oxide thin films can be coupled to an inexpensive soda lime glass substrate, as opposed to more expensive and higher heat and/or chemical resistant glass substrates such as quartz and VYCOR®.

Accordingly, the present teachings also encompass TFT devices that include a substrate (including a substrate-gate material such as, but not limited to, doped-silicon wafer, tin-doped indium oxide on glass, tin-doped indium oxide on mylar film, and aluminum on polyethylene terephthalate), a dielectric material as described herein deposited on the substrate/substrate-gate, a semiconductor material deposited on the dielectric material, and source-drain contacts. In some embodiments, the TFT can be a transparent TFT including one or more of the following: a transparent or substantially transparent substrate, a transparent or substantially transparent gate conductor, a transparent or substantially transparent inorganic semiconductor component, a transparent or substantially transparent dielectric component, and transparent or substantially transparent source and drain contacts. As used herein, "transparent" refers to having at least a 90% transmittance in the visible region of the spectrum, and "substantially transparent" refers to having at least 80% transmittance in the visible region of the spectrum.

In certain embodiments, the present teachings can relate to high-performance metal oxide TFTs fabricated, for example, with the present low temperature-processed metal oxide thin film semiconductor (e.g., $In_2O_3$ or IGZO) on top of a low-temperature-processed amorphous alumina gate dielectric and ITO gate electrode, using a flexible polymer substrate.

In another aspect, the present teachings provide nanomaterial-derived metal oxide thin films with improved surface morphologies and contact among the nanomaterials, which in turn lead to improved electronic properties. Generally, the present nanomaterial-derived metal oxide thin films include a metal oxide nanomaterial and a binder component, wherein the binder component includes a redox reaction product of at least one oxidizing agent and a fuel, wherein the fuel and/or the oxidizing agent(s) comprise the same metal as the metal oxide nanomaterial. The metal oxide nanomaterial typically is present in an amount of at least about 50% by weight based on the overall weight of the metal oxide thin film, whereas the binder component generally is present in an amount of at least about 10% by weight based on the overall weight of the metal oxide thin film.

As used herein, a "nanomaterial" generally has at least one dimension of about 300 nm or smaller. Examples of nanomaterials include nanoparticles (which can have irregular or regular geometries), nanospheres, nanowires (which are characterized by a large aspect ratio), nanoribbons (which has a flat ribbon-like geometry and a large aspect ratio), nanorods (which typically have smaller aspect ratios than nanowires), nanotubes, and nanosheets (which has a flat ribbon-like geometry and a small aspect ratio). Various metal oxide nanomaterials are commercially available or can be prepared by one skilled in the art. Table 2 below provides examples of metal oxide nanomaterials that can be used according to the present teachings.

TABLE 2

| Composition | Types of Nanomaterials |
|---|---|
| ZnO | nanoparticle, nanorod, nanowire |
| GZO (Gallium doped zinc oxide) | nanoparticle |
| $Ga_2O_3$ | nanoparticle |
| $In_{2-x}Ga_xO_3$ | nanoparticle |
| $In_2O_3$ | nanoparticle, nanorod, nanowire |
| ITO (Tin doped indium oxide) | nanoparticle, nanorod, nanowire |
| $SnO_2$ | nanoparticle, nanorod, nanowire |
| ATO (Antimony doped tin oxde) | nanoparticle |
| $BaTiO_3$ | nanoparticle |
| $(Ba,Sr)TiO_3$ | nanoparticle |
| $LiNbO_3$ | nanoparticle |
| $Fe_2O_3$ | nanoparticle |
| $Sb_2O_3$ | nanoparticle |
| $Bi_2O_3$ | nanoparticle |
| CuO | nanoparticle |
| $Co_3O_4$ | nanoparticle |
| $ZnFe_2O_4$ | nanoparticle |
| $PbTiO_3$ | nanowire |

The metal oxide nanomaterials can be electrically conducting, electrically insulating, or semiconducting as described hereinabove. The metal oxide nanomaterials can include one or more metals selected from a transition metal (any Group 3 to Group 11 metal), a Group 12 metal, a Group 13 metal, a Group 14 metal, a Group 15 metal, a lanthanide, and combinations thereof.

In various embodiments, the oxidizing agent can take the form of an oxidizing anion of a metal salt or an ammonium salt. For example, the oxidizing anion can be a nitrate, a perchlorate, a chlorate, a hypochlorite, an azide, an N-oxide, a peroxide, a superoxide, a high-valent oxide, a persulfate, a dinitramide, a nitrocyanamide, a nitroarylcarboxylate, a tetrazolate, or hydrates thereof. In some embodiments, the oxidizing agent can be an acid such as nitric acid. The metal component of the metal salt can include a Group 12 metal, a Group 13 metal, a Group 14 metal, a Group 15 metal, a transition metal, or a lanthanide. In various embodiments, the metal component typically includes the same metal(s) as the metal(s) in the metal oxide nanomaterial. In embodiments where the metal oxide nanomaterial is a mixed oxide, the inorganic reagent typically includes two or more metal salts, in which case, only one of the metal salts needs to include an oxidizing anion. The other metal salts can include either oxidizing or non-oxidizing anion(s) which can be selected from halides (e.g., chlorides, bromides, iodides), carbonates, acetates, formates, propionates, sulfites, sulfates, hydroxides, trifluoroacetates, trifluoromethanesulfonates, tosylates, mesylates, and hydrates thereof.

The fuel as described hereinabove can be an organic compound or the anion of a metal reagent selected to react with the oxidizing agent(s) in an exothermic redox reaction, and in these embodiments, to produce the same metal oxide as the metal oxide nanomaterial. Examples of suitable organic reagents include the various organic fuels described above, such as acetylacetone, urea, formaldehyde, glycine, alanine, N-methylurea, citric acid, ascorbic acid, stearic acid, ammonium bicarbonate, nitromethane, ammonium carbonate, hydrazine, carbohydrazide, oxalyl dihydrazide, malonic acid dihydrazide, tetra formal tris azine, hexamethylenetetramine, and malonic anhydride. Other examples include a metal salt that includes an acetylacetonate, an oxalate, a citrate, an ascorbate, or a stearate. As described above, each of these organic reagents can be decomposed into one or more reducing or reduced moieties such as $COO^-$, CO, $CH_4$, $CH_3O^-$, $NH_2NHOH$, $NH_3$, $N_2H_3^-$, $N_2H_4$, and $N_2H_5^+$ upon oxidation. The fuel generally is present at around 50% to about 200% of the balanced ratio of the oxidizing agent(s) according to propellant chemistry. The balanced chemical reaction equation can be calculated with the oxidation number of the reagents assuming $N_2$, $CO_2$, HX, $H_2O$, $MO_x$ as the final products. For example, the relative molar ratio of the oxidizing agent to the fuel can be about 1 with respect to balanced chemical equation.

In some embodiments, the present nanomaterial-derived metal oxide thin films can be prepared by depositing a first thin film layer from a dispersion of the metal oxide nanomaterial in a solvent or solvent mixture (a "nanomaterial dispersion"), then depositing a second thin film layer from a binder composition that includes a fuel and at least one oxidizing agent in a solvent or solvent mixture, and annealing the composite film that includes the first thin film layer and the second thin film layer. The first thin film layer (or the "metal oxide nanomaterial film") typically is much thicker than the second thin film layer. For example, the first thin film layer generally can have a thickness between about 40 nm and about 1000 nm, whereas the second thin film layer generally has a thickness of less than or about 100 nm. In certain embodiments, the first thin film layer can be annealed prior to the deposition of the second thin film layer from the binder composition. In certain embodiments, the second thin film layer can be deposited from two or more deposition cycles, where each deposition cycle can provide a thin film sublayer having a thickness of less than or about 50 nm, and in particular embodiments, less than or about 5 nm. In certain embodiments, the thin film sublayers can be annealed between each two deposition cycles of such thin film sublayers. In other embodiments, the thin film sublayers can be air-dried between each two intermediate deposition cycles to remove the solvent, but no annealing is performed until the desired thickness of the second thin film layer is achieved. In some embodiments, two or more cycles of (a) depositing the first thin film layer (with or without annealing), (b) depositing the second thin film layer (via a single depositing step or multiple depositing steps with or without annealing in between), and (c) annealing the composite film, can be performed.

The thickness of the first thin film layer and/or the second thin film layer can be controlled by modulating the viscosity of the nanomaterial dispersion and/or the binder composition, as well as varying one or more parameters of the depositing method (such as the number of deposition cycles, the spin or printing speed, and so forth). For example, the viscosity of the nanomaterial dispersion can range from about 2 cP to about 10000 cP at a temperature of about 20° C., and the nanomaterial dispersion can have a nanomaterial loading between about 1 wt % and about 50 wt %. For example, the nanomaterial dispersion can have a nanomaterial loading between about 5 mg/mL and about 500 mg/mL. By comparison, the binder composition can have a viscosity ranging from about 2 cP to about 10000 cP at a temperature of about 20° C., and a solid loading between about 1 wt % and about 50 wt %.

In other embodiments, the present nanomaterial-derived metal oxide thin films can be prepared from a nanomaterial-binder dispersion which includes the metal oxide nanostructure as well as the fuel and the one or more oxidizing agents. Based on the overall weight of the nanomaterial-binder dispersion, the metal oxide nanomaterial can be present in an amount of at least about 20% by weight, while the oxidizing agent(s) can be present in an amount between about 5% by weight and about 80% by weight, and the fuel can be present in an amount between about 2.5% by weight and about 40% by weight.

With either embodiment, the depositing step(s) can be carried out by various solution-phase methods including printing (such as inkjet printing, screen-printing, gravure printing, offset printing, pad printing, lithographic printing, flexographic printing, and microcontact printing), spin-coating, slot-coating, drop-casting, zone casting, dip coating, blade coating, spray-coating, rod coating, or stamping.

Various solvents can be used in the nanomaterial dispersion and in the binder composition. For example, the solvent can be selected from water, an alcohol, an aminoalcohol, a carboxylic acid, a glycol, a hydroxyester, an aminoester, and a mixture thereof. In some embodiments, the solvent can be selected from water, methanol, ethanol, propanol, butanol, pentanol, hexyl alcohol, heptyl alcohol, ethyleneglycol, methoxyethanol, ethoxyethanol, methoxypropanol, ethoxypropanol, methoxybutanol, dimethoxyglycol, N,N-dimethylformamide, and mixtures thereof. In certain embodiments, the binder composition also can include a base such as aqueous ammonia. One or more additives such as detergents, dispersants, binding agents, compatibilizing agents, curing agents, initiators, humectants, antifoaming agents, wetting agents, pH modifiers, biocides, and/or bactereriostats also can be added to the nanomaterial dispersion and/or the binder composition. For example, surfactants, chelates (e.g., ethylenediaminetetraacetic acid (EDTA)), and/or other polymers (e.g., polystyrene, polyethylene, poly-alpha-methylstyrene, polyisobutene, polypropylene, polymethylmethacrylate and the like) can be included as a dispersant, a binding agent, a compatibilizing agent, and/or an antifoaming agent.

The annealing step can be performed under different atmospheres including ambient air, air with controlled humidity level, oxygen-enriched atmospheres, nitrogen-enriched atmospheres, pure oxygen, pure nitrogen, or pure hydrogen as described hereinabove. In various embodiments, the annealing temperature for each of the annealing steps can be less than or about 300° C., less than or about 250° C., in certain cases, less than or about 250° C., and in particular cases, less than or about 150° C. Because of the low-temperature processing, the present method for preparing nanomaterial-derived metal oxide thin films can be performed on various flexible (e.g., plastic) substrates, which typically have a low heat-resistance. The annealing step can be carried out by conventional heat treatment (e.g., in an oven) and/or by irradiation with a radiation source (e.g., infrared (IR) radiation, microwave radiation).

The present nanomaterial-derived metal oxide thin films generally have better electronic properties when compared to metal oxide thin films prepared from identical metal oxide nanomaterials but without the use of the present binder composition. Similarly, the present nanomaterial-derived metal oxide thin films also generally have better electronic properties than those prepared with other organic or inorganic binders known in the art. As demonstrated by the examples hereinbelow, the use of combustion precursors according to the present teachings as a binder leads to unexpected improvements in conductivity (for electrically conducting metal oxides), charge mobility (for semiconducting metal oxides), or leakage current density (for electrically insulating metal oxides). Accordingly, the present nanomaterial-derived metal oxide thin films can be used to provide various thin film semiconductor devices with improved device performance. For example, the present metal oxide thin films can be used as transparent conducting metal oxides in light-emitting devices; electrodes in photovoltaic devices; semiconductors, dielectrics, and/or conductors in thin film transistors.

Accordingly, in one aspect, the present teachings can relate to a method of fabricating a thin film transistor, for example, a top-gate top-contact transistor, a top-gate bottom-contact transistor, a bottom-gate top-contact transistor, or a bottom-gate bottom-contact transistor.

To illustrate, in some embodiments, the present nanomaterial-derived metal oxide thin films can be incorporated into a bottom-gate thin film transistor. For example, the bottom-gate thin film transistor can include a nanomaterial-derived metal oxide thin film according to the present teachings as its semiconductor component. A dispersion of a semiconducting metal oxide nanomaterial can be deposited on a thin film dielectric material to provide a metal oxide nanomaterial semiconductor film in contact with the thin film dielectric, which can be optionally annealed (for example, at a temperature of less than or about 350° C., with or without exposure to a radiation source). A semiconductor binder composition including a redox pair of combustion precursors according to the present teachings is then deposited on the metal oxide nanomaterial semiconductor film. The semiconductor binder composition now in contact with the metal oxide nanomaterial semiconductor film then can be annealed to a temperature of less than or about 350° C. to provide a metal oxide thin film semiconductor. As described before, the semiconductor binder composition can be deposited via one or more deposition cycles with optional annealing treatment in between any two deposition cycles. The oxidizing agent(s) in the semiconductor binder composition typically include the same metal(s) as the semiconducting metal oxide nanomaterial. For example, the metal oxide nanomaterial can include ZnO nanoparticles, ZnO nanorods, ITO nanoparticles, ITO nanorods, $In_2O_3$ nanoparticles, $In_2O_3$ nanorods, $Al_2O_3$ nanoparticles, or mixtures thereof, and the oxidizing agent can include zinc nitrate and/or indium nitrate. The fuel can be an organic fuel such as acetylacetone and/or urea.

The thin film dielectric can be composed of inorganic, organic, or hybrid organic/inorganic materials (examples of which have been provided hereinabove); and coupled to the thin film gate electrode by methods known in the art including self-assembly of nanodielectric materials, vapor-phase or solution-phase deposition of inorganic or organic materials, and solution-phase deposition of inorganic/organic hybrid materials.

However, in certain embodiments, the thin film dielectric can be a nanomaterial-derived metal oxide thin film prepared according to the present methods. As demonstrated in the examples hereinbelow, the implementation of a low-temperature amorphous metal oxide thin film dielectric with a metal oxide thin film semiconductor prepared by the present methods can lead to much improved semiconductor-dielectric interface, which can enhance the transistor performance significantly. Accordingly, in certain embodiments, the thin film gate electrode can be contacted with a dielectric dispersion, where the dielectric dispersion can include an electrically insulating metal oxide nanomaterial such as $Al_2O_3$ nanoparticles or $ZrO_2$ nanoparticles, to provide a metal oxide nanomaterial dielectric film. A dielectric binder composition including a redox pair of combustion precursors according to the present teachings then can be deposited on the metal oxide nanomaterial dielectric film. The dielectric binder composition now in contact with the metal oxide nanomaterial dielectric film then can be annealed to a temperature of less than or about 350° C. to provide a metal oxide thin film dielectric. As described before, the dielectric binder composition can be deposited via one or more deposition cycles with optional annealing treatment in between any two deposition cycles. The oxidizing agent(s) in the dielectric binder composition typically include the same metal(s) as the dielectric metal oxide nanomaterial. For example, the inorganic reagent can include zirconium oxynitrate. The fuel can be an organic fuel such as acetylacetone and/or urea. In certain embodiments, the thin film dielectric can be a metal oxide thin film prepared from a combustion precursor composition according to the present teachings without the use of nanomaterials.

The gate electrode and the other electrical contacts (source and drain electrodes) independently can be composed of metals, transparent conducting oxides, or conducting polymers (examples of which have been provided hereinabove). In certain embodiments, the gate electrode (and/or source and drain electrodes) of the thin film transistor can be a metal oxide thin film (e.g., a transparent conducting oxide such as ITO, IZO, ZITO, GZO, GIO, or GITO) prepared according to the present methods. Accordingly, in certain embodiments, the method can include coupling the thin film gate electrode to a substrate by contacting the substrate with a conductor dispersion, where the conductor dispersion can include an electrically conducting metal oxide nanomaterial such as ITO nanoparticles or ITO nanorods, to provide a metal oxide nanomaterial conductor film. A conductor binder composition including a redox pair of combustion precursors according to the present teachings then can be deposited on the metal oxide nanomaterial conductor film. The conductor binder composition now in contact with the metal oxide nanomaterial conductor film then can be annealed to a temperature of less than or about 350° C. to provide a metal oxide thin film conductor. As described before, the conductor binder composition can be deposited via one or more deposition cycles with optional annealing treatment in between any two deposition cycles. The oxidizing agent(s) in the conductor binder composition typically includes the same metal(s) as the conductor metal oxide nanomaterial. For example, the oxidizing agent can comprise indium nitrate, while the fuel can be an organic fuel such as acetylacetone and/or urea. For preparing an ITO thin film nanocomposite, $SnCl_2$ can be used as the source of tin, optionally with an oxidizing agent such as $NH_4NO_3$. In certain embodiments, the thin film conductor can be a metal oxide thin film prepared from a combustion precursor composition according to the present teachings without the use of nanomaterials.

Examples of various substrate materials have been provided hereinabove. As described previously, because of the low-temperature processing requirements, the substrate can be a low heat-resistant flexible plastic substrate with which prior art conventional precursors for processing oxide thin films are incompatible. Examples of such flexible substrates include polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof. In particular embodiments, the substrate can be an inexpensive rigid substrate that has relatively low heat and/or chemical resistance. For example, the present metal oxide thin films can be coupled to an inexpensive soda lime glass substrate, as opposed to more expensive and higher heat and/or chemical resistant glass substrates such as quartz and VYCOR®.

In some embodiments, the present nanomaterial-derived metal oxide thin films can be incorporated into a top-gate thin film transistor. For example, the top-gate thin film transistor can include a nanomaterial-derived metal oxide thin film according to the present teachings as its gate dielectric component and/or gate dielectric component (and optionally also the semiconductor component). In these embodiments, a dispersion including an electrically insulating metal oxide nanomaterial is deposited on the thin film semiconductor to provide a metal oxide nanomaterial dielectric film. A dielectric binder composition including a redox pair of combustion precursors according to the present teachings then can be deposited on the metal oxide nanomaterial dielectric film. The dielectric binder composition now in contact with the metal oxide nanomaterial dielectric film then can be annealed to a temperature of less than or about 350° C. to provide a metal oxide thin film dielectric. As described before, the dielectric binder composition can be deposited via one or more deposition cycles with optional annealing treatment in between any two deposition cycles. A nanomaterial-derived metal oxide thin film gate electrode can be formed above the thin film dielectric in an analogous manner. In certain embodiments, the thin film semiconductor on which the thin film dielectric is formed also can be a nanomaterial-derived metal oxide thin film and can be prepared analogously on a substrate.

Accordingly, the present teachings also encompass TFT devices that include a substrate (including a substrate-gate material such as, but not limited to, doped-silicon wafer, tin-doped indium oxide on glass, tin-doped indium oxide on mylar film, and aluminum on polyethylene terephthalate), a dielectric material as described herein deposited on the substrate/substrate-gate, a semiconductor material deposited on the dielectric material, and source-drain contacts. In some embodiments, the TFT can be a transparent TFT including one or more of the following: a transparent or substantially transparent substrate, a transparent or substantially transparent gate conductor, a transparent or substantially transparent inorganic semiconductor component, a transparent or substantially transparent dielectric component, and transparent or substantially transparent source and drain contacts. As used herein, "transparent" refers to having at least a 90% transmittance in the visible region of the spectrum, and "substantially transparent" refers to having at least 80% transmittance in the visible region of the spectrum.

FIG. 14 illustrates several different configurations of TFT devices: (a) bottom-gate top-contact structure, (b) bottom-gate bottom-contact structure, (c) top-gate bottom-contact structure, and (d) top-gate top-contact structure. As shown, a TFT (e.g., a field-effect transistor, FET, or a light-emitting transistor, LET) can include a gate dielectric component (e.g., shown as 8, 8', 8", and 8'"), a semiconductor component or semiconductor layer (e.g., shown as 6, 6', 6", and 6'"), a gate electrode or contact (e.g., shown as 10, 10', 10", and 10'"), a substrate (e.g., shown as 12, 12', 12", and 12'"), and source and drain electrodes or contacts (e.g., shown as 2, 2', 2", 2'", 4, 4', 4", and 4'"). As shown, in each of the configurations, the semiconductor component is in contact with the source and drain electrodes, and the gate dielectric component is in contact with the semiconductor component on one side and the gate electrode on an opposite side. For OLETs, similar architecture can be adopted where the semiconductor layer is replaced with one or more layers that individually or in combination perform the functions of hole transport, electron transport, and emission.

In another aspect, the present teachings can relate to a method of fabricating a photovoltaic device including a substrate, a thin film metal oxide anode, a photoactive component, a thin film metal oxide cathode, and optionally one or more thin film metal oxide interfacial layers which can be deposited between the anode and the photoactive component and/or between the cathode and the photoactive component. In certain embodiments, at least one of the thin film anode and the thin film cathode can be a metal oxide thin film conductor (prepared from a combustion precursor composition without nanomaterials) or a nanocomposite-based metal oxide thin film conductor (prepared with combustion precursors either as a coating over the nanomaterial film or as binders within the nanomaterial film) according to the present teachings. A dispersion including an electrically conducting metal oxide nanomaterial (e.g., ITO nanoparticles, ITO nanorods) can be deposited on the substrate or the photoactive component to provide a metal oxide nanomaterial conductor film. Following an optional annealing step, a conductor binder composition including a redox pair of combustion precursors according to the present teachings is then deposited on the metal oxide nanomaterial conductor film. The conductor binder composition now in contact with the metal oxide nanomaterial conductor film then can be annealed to a temperature of less than or about 350° C. to provide a metal oxide thin film conductor. As described before, the conductor binder composition can be deposited via one or more deposition cycles with optional annealing treatment in between any two deposition cycles. The oxidizing agent(s) in the semiconductor binder composition typically includes the same metal(s) as the semiconducting metal oxide nanomaterial. For example, the oxidizing agent(s) can include indium nitrate. The fuel can be an organic fuel such as acetylacetone and/or urea. In some embodiments, the thin film metal oxide thin film interlayer can be a metal oxide thin film (including a nanocomposite-based metal oxide thin film conductor) prepared according to the present teachings. For example, NiO or α-IZO thin films can be prepared from a redox pair of combustion precursors comprising nickel nitrate or indium nitrate and zinc nitrate together with a fuel such as acetylacetone.

The photoactive component disposed between the thin film anode and the thin film cathode can be composed of a blend film which includes a "donor" material and an "acceptor" material. For bulk heterojunction (BHJ) organic photovoltaic devices, the acceptor material typically is a fullerene-based compound such as C60 or C70 "bucky ball" compounds functionalized with solubilizing side chains. Specific examples include C60 [6,6]-phenyl-C61-butyric acid methyl ester ($C_{60}$PCBM) or $C_{70}$PCBM. A common donor material used in BHJ solar cells is poly(3-hexylthiophene) (P3HT), but other conjugated semiconducting polymers suitable as donor materials are known in the art and can be used according to the present teachings. Exemplary polymers can include those described in International Publication Nos. WO 2010/135701 and WO 2010/135723.

FIG. 15 shows two different structures of bulk-heterojunction (BHJ) solar cells. As shown in FIG. 15a, the conventional configuration includes a transparent substrate 20 (e.g., glass), a transparent high work-function anode 22 (e.g., ITO or FTO), a low work-function cathode 26, and a photoactive (bulk-heterojunction) layer 24 disposed between the transparent electrode and the cathode. In some cases, there can be an interlayer 28 between the top electrode and the photoactive layer. For example, when the cathode is Al, an interlayer composed of LiF often is used. Additionally, between the transparent anode 22 and the photoactive layer 24, there can be an interlayer functioning as either a hole-transport layer (HTL) (also known as a hole injection layer (HIL)) and/or an electron blocking layer (EBL) 30. FIG. 15b illustrates a BHJ solar cell having an inverted structure. Specifically, an air-stable high-work function metal (e.g., Ag) is used as the top (back) electrode 32. The HTL/EBL 30, instead of being an interlayer between the transparent anode 22 and the photoactive layer 24 as in the conventional structure, is positioned between the photoactive layer 24 and the top electrode 32. An additional interlayer 34 functioning as either an electron-transport layer (ETL) (also known as an electron injection layer (EIL) or a hole blocking layer can be present. Metal oxide thin films of the present teachings can be used as the electrodes (anode and/or cathode) and/or the interfacial layers (hole and/or electron transport layer).

The present metal oxide thin films also can be used to enable other types of thin film photovoltaic devices. For example, a dye-sensitized solar cell can include a thin film of mesoporous anatase ($TiO_2$) prepared according to the present teachings. Specifically, a precursor composition including $Ti(NO_3)_4 \cdot 4H_2O$ and a fuel such as acetylacetone or urea can be deposited onto an FTO-coated glass substrate to provide an anatase film having a thickness of at least about 50 nm, followed by annealing of the film at a temperature less than or about 350° C., thereby providing a light-converting anode. The anatase/FTO/glass plate then can be immersed in a sensitizing dye solution (e.g., a mixture including a photosensitive ruthenium-polypyridine dye and a solvent) to infuse the pores within the anatase film with the dye. A separate plate is then made with a thin layer of electrolyte (e.g., iodide) spread over a conductive sheet (typically Pt or Pt-coated glass) which is used as the cathode. The two plates are then joined and sealed together to prevent the electrolyte from leaking.

In addition to thin film transistors and thin film photovoltaic devices, the low temperature-processed metal oxide thin films described herein can be embodied within various organic electronic, optical, and optoelectronic devices such as sensors, capacitors, unipolar circuits, complementary circuits (e.g., inverter circuits), ring oscillators, and the like.

The following examples are provided to illustrate further and to facilitate the understanding of the present teachings and are not in any way intended to limit the invention.

Example 1

Preparation and Thermal Analysis of Metal Oxide Precursor Compositions

All reagents were purchased from Sigma-Aldrich and used as received.

Example 1A

Preparation of IZO Precursor Composition ($In_{0.7}Zn_{0.3}O_{1.35}$)

Indium nitrate ($In(NO_3)_3 \cdot 2.85H_2O$, 352.2 mg) was dissolved in 5 mL of 2-methoxyethanol, to which 0.2 mL of acetylacetone was added. Zinc nitrate ($Zn(NO_3)_2 \cdot 6H_2O$, 297.5 mg) was dissolved in 5 mL of 2-methoxyethanol, to which 0.2 mL of acetylacetone was added. After complete dissolution of the metal nitrate, 114 μL of 14.5 M $NH_{3(aq)}$ was added to each solution, which was then aged for 12 hours. The indium zinc oxide (IZO) precursor composition was obtained by mixing the two component solutions at the ratio of In:Zn=7:3 with stirring for one hour.

Example 1B

Preparation of ITO Precursor Composition ($In_{0.9}Sn_{0.1}O_{1.55}$)

Indium nitrate ($In(NO_3)_3 \cdot 2.85H_2O$, 352.2 mg) was dissolved in 5 mL of 2-methoxyethanol, to which 0.2 mL of acetylacetone was added. After complete dissolution of the metal nitrate, 114 μL of 14.5 M $NH_{3(aq)}$ was added, and the solution was aged for 12 hours. Tin chloride ($SnCl_2$, 189.6 mg) was dissolved in 5 mL of 2-methoxyethanol, to which 0.2 mL of acetylacetone was added. After completely dissolving the $SnCl_2$, 57 μL of 14.5 M $NH_{3(aq)}$ was added, and the solution was aged for 12 hours. The indium tin oxide (ITO) precursor composition was obtained by mixing the two component solutions at the ratio of In:Sn=9:1 with stirring for one hour.

Example 1C

Preparation of $In_2O_3$ Precursor Composition

Indium nitrate ($In(NO_3)_3 \cdot 2.85H_2O$, 352.2 mg) was dissolved in 5 mL of 2-methoxyethanol, to which 0.2 mL of acetylacetone was added. After complete dissolution of the metal nitrate, 114 μL of 14.5 M $NH_{3(aq)}$ was added, and the precursor composition was aged for 12 hours.

Example 1D

Preparation of ZTO Precursor Composition ($Zn_{0.3}Sn_{0.7}O_{1.7}$)

Zinc nitrate ($Zn(NO_3)_2 \cdot 6H_2O$, 297.5 mg) and urea (100.1 mg) were dissolved in 5 mL of 2-methoxyethanol. Tin chloride ($SnCl_2$, 189.6 mg), urea (60.1 mg), and ammonium nitrate ($NH_4NO_3$, 80.1 mg) were dissolved in 5 mL of 2-methoxyethanol. The two solutions were then aged for 72 hours. To obtain the zinc tin oxide (ZTO) precursor composition, the two component solutions were mixed at the ratio of Zn:Sn=3:7, followed by stirring for one hour.

Example 1E

Thermal Analysis

Thermal analyses were carried out on 10-15 mg samples prepared from evaporated precursor compositions (Examples 1A-1D) at a heating rate of 10° C. $min^{-1}$ under a 20 mL $min^{-1}$ air flow. Comparative thermal analyses were carried out on dried samples similarly obtained from evaporated conventional precursor compositions based on metal halides, hydroxides, and/or metal alkoxides.

In FIGS. 1a-1d, thermogravimetric analysis (TGA) and differential thermal analysis (DTA) data are plotted for various precursor compositions of $In_2O_3$, α-ZTO ($Zn_{0.3}Sn_{0.7}O_{1.7}$ for combustion precursors, $Zn_{1.0}Sn_{1.0}O_{3.0}$ for conventional precursors), α-IZO ($In_{0.7}Zn_{0.3}O_{1.35}$ for combustion precursors, $In_{1.0}Zn_{1.0}O_{2.5}$ for conventional precursors), and ITO ($In_{0.9}Sn_{0.1}O_{1.55}$). The conventional precursor compositions were prepared as described in Yan et al., *Nature*, 457: 679-686 (2009) ($In_2O_3$); Seo et al., *J. Phys. D*, 42: 035106 (2009) ($ZnSnO_3$); Choi et al., *Electrochem. Solid-State Lett.*, 11: H7-H9 (2008) ($InZnO_{2.5}$); and Sakanoue et al., *Nature Mater.*, 9: 736-740 (2010) ($In_{0.9}Sn_{0.1}O_{1.55}$); the disclosure of each of which is incorporated by reference herein.

As shown, all of the combustion precursor systems exhibit substantially lower complete conversion temperatures ($T_{completion}$<200-300° C.) than the conventional systems ($T_{completion}$>500-600° C.). Specifically, unlike conventional systems which exhibit broad endotherms for oxide lattice formation and exotherms for organic impurity removal, the combustion systems, with the exception of ZTO, exhibit a single, intense exotherm in the DTA, which corresponds exactly to the abrupt mass loss in the TGA. This supports that the energy from the exothermic reaction is sufficient to drive the reaction rapidly to completion.

Example 2

Fabrication and Characterization of Metal Oxide Thin Films

Example 2A

Film Fabrication

The $In_2O_3$, IZO, and ZTO precursor compositions (total metal concentration=0.05 M) were spin-coated on n++ Si wafers (Montco Silicon Technologies, Inc.) at 3500 r.p.m. for 35 seconds, then annealed at the desired temperature ($T_{anneal}$=150° C.-400° C.) for 30 minutes under air. ITO films were fabricated by spin-coating the precursor composition (total metal concentration=0.4 M) at 2000 r.p.m. for 35 seconds, then annealed at the desired temperature ($T_{anneal}$=200° C.-500° C.) for 30 minutes under air. These processes were repeated as necessary to achieve the desired film thickness.

Example 2B

Film Characterization

Film surface morphologies were imaged with a Veeco Dimension ICON PT AFM System and a Hitachi S-4800-II FE-SEM. Grazing incident angle X-ray diffraction (GI-AXRD) scans were measured with a Rigaku ATX-G Thin-Film Diffraction Workstation using Cu Kα radiation coupled to a multilayer mirror. Film thicknesses were determined by profilometry for ITO and by X-ray reflectivity or ellipsometry for thin dielectric and semiconductor films. Optical spectra were acquired with a Cary 5000 ultraviolet-visible-near-infrared spectrophotometer and were referenced to uncoated Corning 1737F glass. XPS spectra were recorded on an Omicron ESCA Probe system with a base pressure of $8 \times 10^{-10}$ mbar (UHV), using a monochromated Al Kα X-ray source at hv=1486 eV. Quantitative secondary ion mass spectroscopic (SIMS) analysis was performed on a MATS quadrupole SIMS instrument using a 15 keV $Ga^+$ ion source.

GIAXRD data (FIGS. 2a, 2b, and 2c) confirm that the combustion precursor compositions converted to the desired crystalline oxides, $In_2O_3$ and ITO, at far lower temperatures than the conventional precursors. In both combustion syntheses, phase-pure bixbyite $In_2O_3$ phases were formed after precursor ignition at about 200° C.

Figure 3:
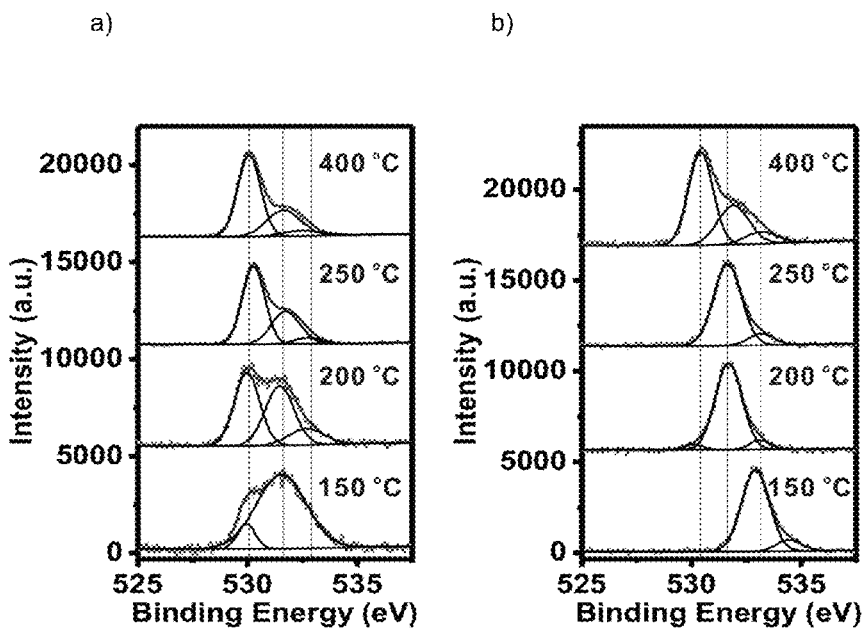
FIGS. 3a-b show x-ray photoelectron spectroscopy (XPS) spectra of $In_2O_3$ films deposited with (a) combustion precursors according to the present teachings and (b) conventional precursors and annealed at the indicated temperatures (530.1 eV: M-O-M lattice oxygen, 531.1 eV: M-OH metal hydroxide oxygen, 532.3 eV: adsorbed oxygen species).

X-ray photoelectron spectroscopy (XPS) analysis further verified complete conversion of the combustion precursor compositions to oxide. The O1s scans in FIGS. 3a and 3b reveal the evolution of both types of $In_2O_3$ precursor films through the annealing process, with the characteristic metal-oxygen-metal (M-O-M) lattice feature at 530.1 eV increasing with increasing $T_{anneal}$. These results agree well with the above GIAXRD and thermal analysis data. Without wishing to be bound to any particular theory, the feature at 531.6 eV could be attributed to either surface or bulk In—OH species. The dominant In—OH feature at low annealing temperatures also confirms incomplete formation of the oxide lattice. The additional peak at 532.3 eV can be assigned to adsorbed oxygen species ($H_2O$, $CO_2$, etc.).

In addition to low conversion temperatures, the present combustion precursor compositions also can lead to much lower impurity levels in the final oxide films as compared to conventional precursor compositions (FIGS. 4a and 4b).

To obtain optimal transistor performance, the surface morphology of the metal oxide thin films is critical. In particular, the metal oxides need to be densified sufficiently so that the resulting thin films are smooth, nanstructurally well-defined, strongly adherent, conformal, fully dense and virtually pinhole-free.

To achieve the necessary surface morphology, it has been found that the thin film layer obtained from each deposition-annealing cycle is preferably less than about 40 nm thick. Further, after each deposition (e.g., spin-coating) step, the metal oxide thin film should be annealed immediately to ensure that optimal densification occurs. Accordingly, although the present metal oxide thin films can have a final thickness up to about 1 micron, thicker films (e.g., thicker than about 40 nm) typically are obtained from multiple deposition-annealing cycles, where each deposition-annealing cycle provides a layer of less than about 40 nm thick.

Referring to FIG. 5a, it can be seen that when a 80 nm-thick metal oxide film was deposited from a single deposition-annealing cycle, the resulting film has cracks and the surface is not smooth. Surface smoothness was improved significantly when a metal oxide film of the same thickness was deposited from four deposition-annealing cycles, where each deposition-annealing cycle provides a layer of about 20 nm thick (FIG. 5b). When a 20 nm metal oxide film was deposited from four deposition-annealing cycles, where each deposition-annealing cycle provides a 5 nm layer, the resulting film was observed to be extremely smooth and dense, with no visible cracks or pinholes.

Example 3

Device Fabrication

The electronic properties of the present metal oxide thin films were evaluated in thin film transistors (TFTs). Top-contact bottom-gate TFT device structure was used.

TFT performance parameters such as saturation mobility ($\mu_{Sat}$), subthreshhold swing (S), and interfacial trap density ($D_{it}$), were evaluated with the conventional metal-oxide-semiconductor field effect transistor (MOSFET) model described in equations (1) and (2) below:

$$\mu_{Sat} = \left(\frac{\partial \sqrt{I_{DS}}}{\partial V_G}\right)^2 \frac{2L}{WC_i} \quad (1)$$

$$S = \frac{dV_G}{d(\log I_{SD})} \approx \ln 10 \frac{kT}{q}\left[1 + \frac{qD_{it}}{C_i}\right] \quad (2)$$

TFT device characterization was performed on a customized probe station in air with a Keithley 6430 subfemtometer and a Keithley 2400 source meter, operated by a locally written Labview program and GPIB communication.

Example 3A

Si/$SiO_2$/Metal Oxide/Al Top-Contact TFTs

Spin-coated, combustion synthesis-derived $In_2O_3$, IZO, and ZTO thin films were deposited on p+Si/300 nm $SiO_2$ as semiconductors. Thermally grown 300-nm thick aluminum source and drain electrodes (2000 μm channel width, 100 μm channel length) completed the device structure. Comparative devices were fabricated with conventional precursor-derived oxide films. Transistor parameters (mobility, $I_{on}/I_{off}$) are summarized in Table 3.

TABLE 3

| Metal Oxide | Conventional Precursor | | | Combustion Synthesis Based Precursor | | |
|---|---|---|---|---|---|---|
| | $T_a$ (° C.) | Mobility ($cm^2$/Vs) | $I_{on}/I_{off}$ | Metal Oxide | $T_a$ (° C.) | Mobility ($cm^2$/Vs) | $I_{on}/I_{off}$ |
| $In_2O_3$* | 400° C. | 0.7 | $10^6$ | $In_2O_3$ | 180° C. | Inactive (μ~$10^{-6}$)‡ | |
| $In_2O_3$ | 200° C. | Inactive | | | 200° C. | 0.81 | $10^6$ |
| | 250° C. | Inactive (μ~$10^{-4}$)‡ | | | 225° C. | 1.81 | $10^6$ |
| | 300° C. | 2.30 | $10^4$ | | 250° C. | 3.37 | $10^7$ |
| | 400° C. | 5.92 | $10^2 - 10^4$ | | 300° C. | 6.5 | $10^4$ |
| | | | | | 325° C. | 9.4 | $10^3$ |
| $ZnSnO_3$ | 200° C. | Inactive | | $Zn_{0.3}Sn_{0.7}O_{1.7}$ | 200° C. | Inactive (μ~$10^{-4}$)‡ | |
| | 250° C. | Inactive (μ~$10^{-5}$)‡ | | | 225° C. | 0.29 | $10^4$ |
| | 300° C. | Inactive (μ~$10^{-5}$)‡ | | | 250° C. | 1.76 | $10^7$ |
| | 350° C. | 0.03 | $10^4$ | | 300° C. | 3.03 | $10^6$ |
| | 400° C. | 1.67 | $10^7$ | | 350° C. | 7.02 | $10^4$ |
| | | | | | 400° C. | 7.34 | $10^3$ |
| $InZnO_{2.5}$ | 250° C. | Inactive (μ~$10^{-4}$)‡ | | $In_{0.7}Zn_{0.3}O_{1.35}$ | 200° C. | Inactive (μ~$10^{-3}$)‡ | |
| | 300° C. | 0.22 | $10^5$ | | 225° C. | 0.32 | $10^6$ |
| | 350° C. | 1.37 | $10^5$ | | 250° C. | 0.91 | $10^6$ |
| | 400° C. | 2.14 | $10^5$ | | 300° C. | 3.20 | $10^5$ |
| | | | | | 400° C. | 9.78 | $10^4$ |

*Values obtained from Kim et al., "High performance solution-processed indium oxide thin-film transistors," *J. Am. Chem. Soc.*, 130: 12580-12581 (2008) (TFT with 50 nm Au electrode).
‡Several devices are inactive and some devices are active with maximum mobilities in parenthesis.

FIGS. 6a-c plot carrier mobility, μ, against the annealing temperature for the $In_2O_3$, ZTO, and IZO TFT devices derived from the two types of precursors. For the conventional precursor route, it can be seen that adequate device performance typically is possible only for annealing temperatures greater than that for metal oxide lattice formation or organic impurity oxidation (i.e., ≥300° C.).

However, in the combustion systems, annealing temperatures as low as 200° C. often are sufficient for good device performance. Without wishing to be bound by any particular theory, it is believed that the principal driving force for oxide lattice formation in combustion synthesis derives principally from internal chemical energy, that is, the required applied temperature can be described as that for reaction initiation, rather than one that must be continuously maintained to drive the reaction.

Figure 1:
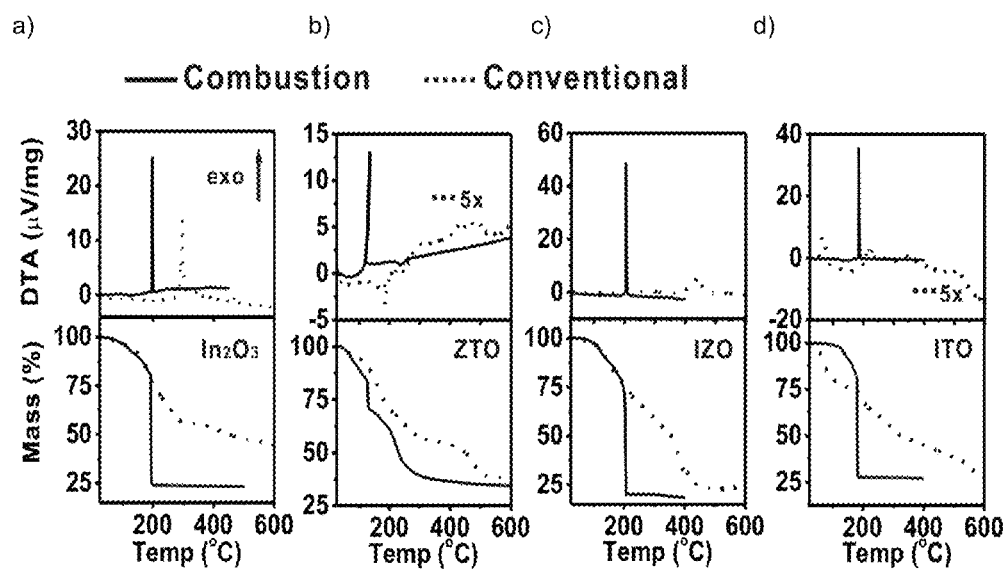
FIGS. 1a-d compare differential thermal analysis (DTA, top) and thermogravimetric analysis (TGA, bottom) data of combustion precursors according to the present teachings (solid) versus conventional precursors (dotted) of the following metal oxides: (a) $In_2O_3$, (b) ZTO, (c) IZO, and (d) ITO.

For example, referring to FIG. 1a and the mobilities reported in Table 1, it can be seen that the onset of TFT function in $In_2O_3$ is well-matched with the thermal analysis results. By increasing the annealing temperature to about 200° C., a mobility of ~0.81 $cm^2/Vs$ can be achieved, which is comparable to that of a-Si:H. Generally, a continuous mobility increase can be observed with increasing temperature. Without wishing to be bound by any particular theory, it is believed that this trend is related to oxygen vacancy generation pre-filling trap sites and/or distortional relaxation reducing trap sites.

With respect to IZO, the IZO onset temperature was observed to exceed the conversion temperature. This can be understood by considering the following observations. From the thermal analysis data in FIG. 1c and mobility trends in FIG. 5c, IZO conversion appears to occur at about 200° C. However, the TFT mobility increases further with temperature, well beyond 225° C. Furthermore, for a given processing temperature, the observed mobility is significantly lower than that of $In_2O_3$ films (FIG. 5a). Without wishing to be bound to any particular theory, it is believed that these trends can be related to insufficient oxygen vacancy generation at low processing temperatures due to strong oxygen binding by $Zn^2$.

The urea-based ZTO systems evidence slightly different trends in the thermal analysis data. Specifically, the ZTO DTA scan reveals a sharp, intense exotherm at 110° C. and a small broad endotherm at around 250° C., with corresponding abrupt and gradual mass losses (FIG. 1b). GIAXRD analysis (FIG. 2e) reveals that the film is amorphous up to 400° C. However, these ZTO films undergo conversion to a metal oxide semiconductor at around 225° C., judging from the TFT response shown in FIG. 5b. Specifically, even below complete conversion at about 250° C., the TFTs exhibit a mobility of about 0.4 $cm^2/Vs$ near 225° C. Without wishing to be bound by any particular theory, it is believed that a "chemical oven" effect is at play where an ignition between the low-temperature ignitable urea-ammonium nitrate pair exotherm is coupled to a weakly endothermic Zn—Sn—O reaction at higher temperatures and drives the reaction to completion if the ignition generates sufficient heat. Thus, upon exposing the present ZTO films even to moderate temperatures (~225° C., which is significantly lower than conventional precursor systems), the internal chemical energy combined with external thermal energy is sufficient to induce complete oxide conversion.

Example 3B

Sn-Doped Indium Oxide Transparent Conducting Oxide

Sn-doped $In_2O_3$ ($In_{0.9}Sn_{0.1}O_{1.55}$) thin films were prepared as follows: An ITO precursor composition according to Example 1B having a total metal concentration of about 0.4 M was spin-coated on 300 nm $SiO_2/Si$ at 2000 r.p.m. for 35 seconds, then annealed at the desired temperature ($T_{anneal}$=200° C.-500° C.) for 30 minutes under air. This process was repeated up to the desired thickness. For final annealing, the ITO films were annealed for one hour under hydrogen at the same temperature as the air annealing step for $T_{anneal}$<300° C. or at 300° C. for $T_{anneal}$>300° C.

Conductivities of the ITO thin films on 300 nm $SiO_2/Si$ were measured with a Keithley 2182A nanovoltmeter and 6221 current source using the four-probe method. The results are summarized in Table 4, along with comparison values obtained with conventional sol-gel type $In_{0.9}Sn_{0.1}O_{1.55}$ precursors reported in Alam et al., "Investigation of annealing effects on sol-gel deposited indium tin oxide thin films in different atmosphere," Thin Solid Films, 420: 76-82 (2002), the disclosure of which is incorporated by reference herein.

Figure 2:
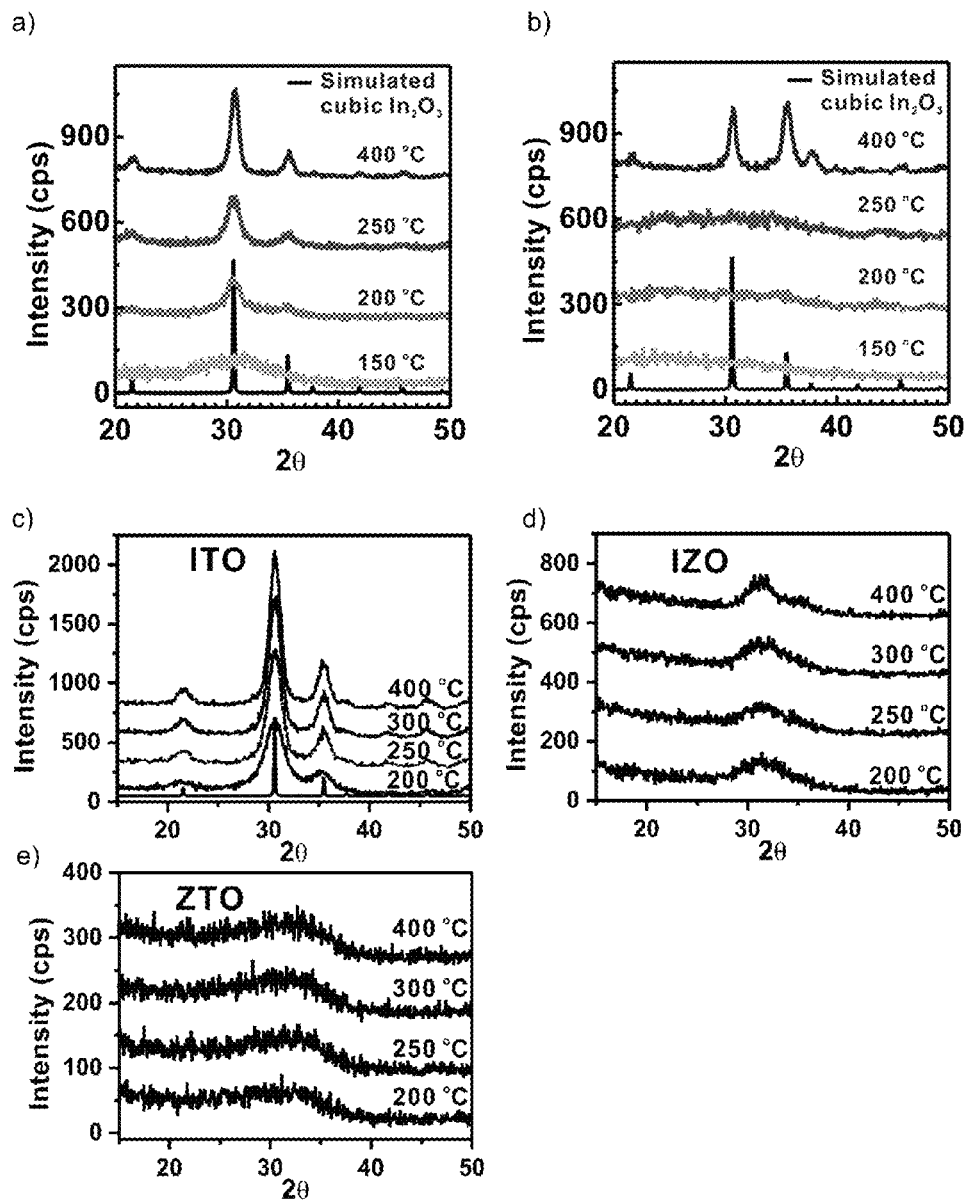
FIGS. 2a-e show grazing incident angle x-ray diffraction (GIAXRD) data of various oxide films deposited using combustion precursors according to the present teachings or conventional precursors and annealed at the indicated temperatures: (a) $In_2O_3$ film deposited using combustion precursors; (b) $In_2O_3$ film deposited using conventional precursors; (c) ITO deposited using combustion precursors; (d) IZO film deposited using combustion precursors; and (e) ZTO film deposited using combustion precursors.

The thermal analysis and GIAXRD data in FIGS. 1d and 2c support that crystalline ITO can be formed at temperatures as low as 200° C. from the combustion precursor systems. Because the ITO precursor system is highly oxidizing and was used under air, mild post-annealing treatment in a reducing environment was required to obtain high ITO carrier concentrations. By maintaining the combustion-derived ITO films under an $H_2$ atmosphere either at the same temperature as $T_{anneal}$ (when $T_{anneal}$<300° C.) or at 300° C. (when $T_{anneal}$>300° C.), significant carrier densities were achieved. FIG. 7 compares the conductivities of ITO films derived from combustion precursors versus the conductivities of ITO films derived from conventional precursors at different annealing temperatures.

TABLE 4

| Metal Oxide | $T_a$ (° C.) | Conductivity (S/cm) |
|---|---|---|
| Conventional Precursor | | |
| $In_{0.9}Sn_{0.1}O_{1.55}$ (ITO) | 300° C. | ~100 |
| | 400° C. | ~250 |
| | 500° C. | ~1200 |
| Combustion Synthesis Based Precursor | | |
| $In_{0.9}Sn_{0.1}O_{1.55}$ (ITO) | 200° C. | 0.35 |
| | 225° C. | 15 |
| | 250° C. | 130 |
| | 300° C. | 140 |
| | 400° C. | 440 |
| | 500° C. | 680 |

For low annealing temperatures of about 200° C., the film conductivity obtained was about 0.35 S/cm. Considering the GIAXRD evidence for complete conversion to crystalline ITO at 200° C. (FIG. 2c), this modest conductivity can be attributed to insufficient free carrier concentrations at these low temperatures. However, by increasing the annealing temperature slightly to about 250° C., a conductivity of about 130 S/cm was obtained, which is comparable to that of the conducting corrosive polymer PEDOT:PSS. Also, it should be noted that an annealing temperature of about 250° C. or lower makes the present ITO films thermally compatible with commercial high-temperature polymer substrates such as polyether ether ketones, polyimides, and polyarylates.

A continuous increase in conductivity with increasing annealing temperature was observed for the solution-processed ITO, up to about 680 S/cm for $T_{anneal}$=500° C. While these values are insufficient for transparent data bus lines requiring metal-like conductivity, they suffice for TFT contact electrodes. It should be noted that solution-processed electrodes based on Au or Ag typically show poor contact resistance for oxide semiconductors versus Al or ITO. Because ITO is an excellent contact material for n-type oxide semiconductors, obtaining such contacts via low-temperature solution processing can be advantageous.

Example 3C n++Si/α-Alumina/In$_2$O$_3$/Al Top-Contact TFTs

This example demonstrates the integration of a low-temperature solution-processed amorphous alumina dielectric with a combustion-processed In$_2$O$_3$ thin film semiconductor.

Amorphous alumina dielectric films were spin-coated from a precursor solution composed of Al(NO$_3$)$_3$·9H$_2$O in 2-methoxyethanol (total metal concentration=0.1 M) on n$^+$-Si, then annealed at 200° C. or 250° C. for 30 minutes for each layer with an initial one-minute oxygen plasma treatment. This process was repeated up to the desired thickness. Semiconducting In$_2$O$_3$ thin films were deposited at the lowest combustion temperatures as described in Example 3A. The leakage current and capacitance of α-alumina were measured with a Keithley 6430 subfemtometer and an HP4192A LF using thermally evaporated 50 nm thick Au electrodes (200 μm×200 μm).

As shown in FIG. 8, α-alumina films deposited at 250° C. and 200° C. exhibit far higher capacitances, 188 nF/cm$^2$ and 173 nF/cm$^2$, respectively (measured at 10 kHz) compared to a 300 nm SiO$_2$ dielectric, which has a reported capacitance value of about 11 nF/cm$^2$. The α-alumina films also exhibit low leakage currents (~10$^{-7}$ A/cm$^2$ at 1 MV/cm) at low operating voltages (~2 V), with minimal frequency sensitivity of the capacitance (~10% difference from 1 kHz to 1 MHz).

Figure 9:
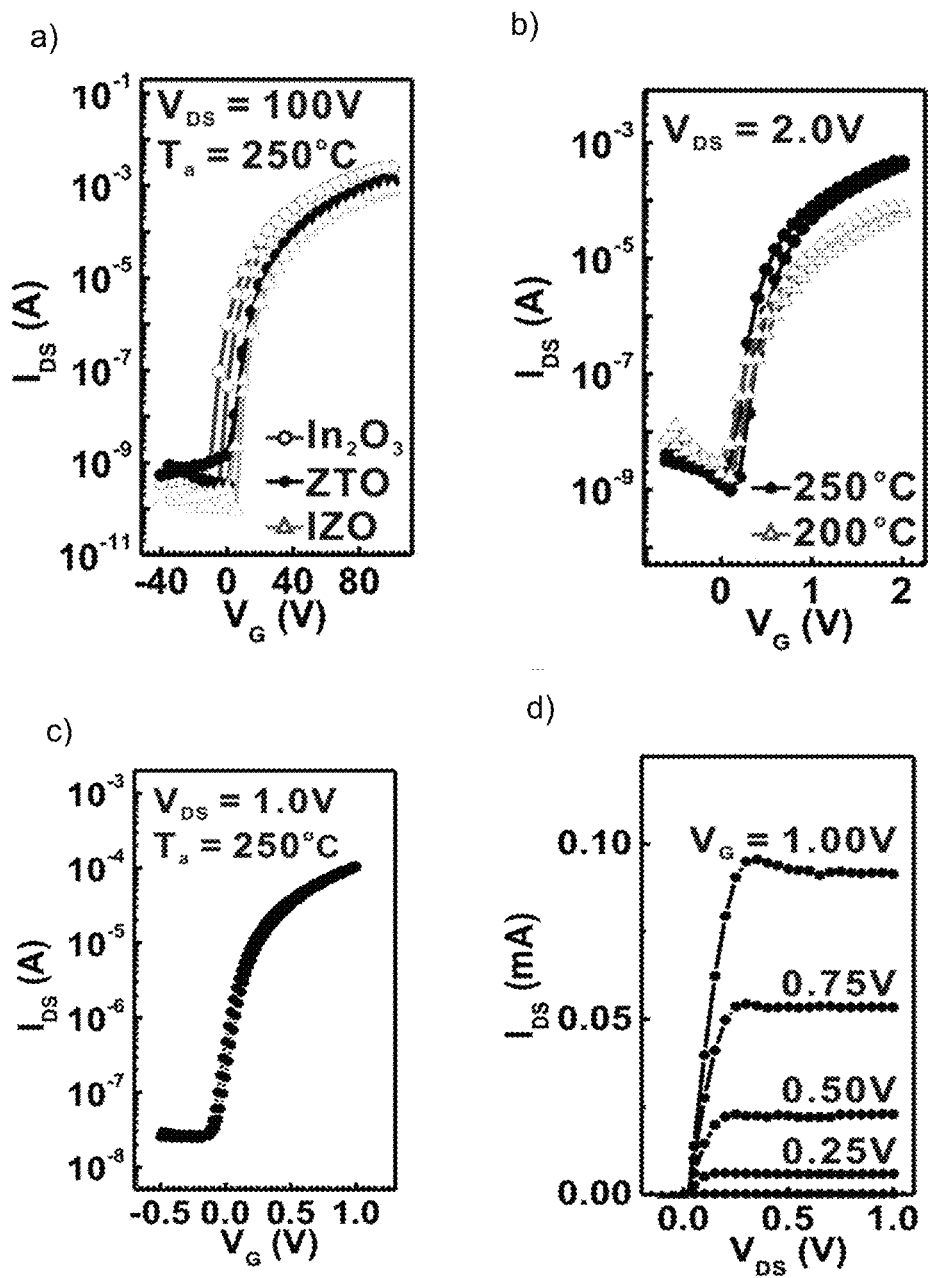

In addition, a significant TFT mobility enhancement was observed upon changing the dielectric from SiO$_2$ to α-alumina (FIG. 9b, Table 5 below). For example, for T$_{anneal}$=250° C., μ$^{sat}$ increased from 3.4 cm$^2$/Vs (SiO$_2$) to 39.5 cm$^2$/Vs (a-alumina). Significant reduction in interfacial trap density (D$_{it}$) from 2.1×10$^{12}$ cm$^{-2}$ eV$^{-1}$ (SiO$_2$) to 5.9×10$^{11}$ cm$^{-2}$ eV$^{-1}$ (α-alumina), as calculated from the subthreshhold swing (S) data, indicates that the principal origin of the increased performance is the improved semiconductor-dielectric interface.

Example 3D

In$_2$O$_3$/38 nm α-Alumina/250 nm ITO/1737F Glass Top-Contact TFTs

This example demonstrates that all-oxide solution-processed TFTs can be fabricated with annealing temperatures at or below about 250° C. Specifically, a solution-processed combustion precursor-derived oxide semiconductor (Example 3A, In$_2$O$_3$), a solution-processed combustion precursor-derived oxide gate electrode (Example 3b, ITO) and a solution-processed combustion precursor-derived oxide dielectric (Example 3C, α-alumina) were combined on a glass substrate (Corning 1737F). For completion of this top-contact/bottom-gate structure, 30 nm Al source and drain electrodes of 2000 μm×100 μm channel dimensions were defined by thermal evaporation.

Performance of the resulting TFT was found to be comparable to that of devices fabricated on highly conducting n++Si gate electrodes with μ=36.2 cm$^2$/Vs$^{-1}$ and I$_{on}$/I$_{off}$~10$^4$ (FIGS. 9c and 9d). Such a device also shows high optical transparency in the visible region (T>80%).

Example 3E

Flexible Combustion-Processed Oxide TFTs

The ultimate goal of solution processing is to realize high-throughput oxide devices on flexible substrates. To demonstrate the efficacy of the present combustion approach for flexible circuitry, a transparent AryLite™ polyester substrate (A200HC from Ferrania Technology) was investigated as an example of a suitable flexible substrate. A 30 nm thick Al gate (1000 μm wide, vacuum-deposited) and an α-alumina dielectric were deposited in sequence on the AryLite™ substrate. The In$_2$O$_3$ semiconductor was spin-coated from a combustion precursor composition on the α-alumina as described above.

FIGS. 10a and 10b show transfer and output plots of the resulting device. The resulting In$_2$O$_3$ device on the flexible AryLite™ substrate affords reasonable performance with μ$^{sat}$=6.0 cm$^2$/Vs and I$_{on}$/I$_{off}$~10$^3$.

Table 5 summarizes the electrical properties of combustion precursor-derived spin-coated In$_2$O$_3$ semiconducting films on various substrates using 30 nm Al source/drain electrodes.

TABLE 5

| Substrate | T$_a$ (° C.) | Mobility (cm$^2$/Vs) | I$_{on}$/I$_{off}$ | V$_{TH}$ (V) | S (V/dec) | D$_{it}$ (cm$^{-2}$eV$^{-1}$) |
|---|---|---|---|---|---|---|
| 300 nm SiO$_2$/p+ Si | 200 | 0.81 | 10$^6$ | 17.6 | 2.9 | 3.3 × 10$^{12}$ |
|  | 250 | 3.37 | 10$^7$ | 16.5 | 1.9 | 2.1 × 10$^{12}$ |
| alumina / n++ Si | 200 | 12.6 | 10$^4$ | 0.54 | 0.14 | 1.5 × 10$^{12}$ |
|  | 250 | 39.5 | 10$^5$ | 0.43 | 0.09 | 6.1 × 10$^{11}$ |
| alumina/ITO/1737F | 250 | 36.2 | 10$^4$ | 0.00 | 0.10 | 8.1 × 10$^{11}$ |
| alumina/Al/Arylite | 200 | 5.97 | 10$^3$ | 0.34 | 0.15 | 1.7 × 10$^{12}$ |

Example 3F

Inkjet-Printed Combustion-Processed Oxide TFTs

This example demonstrates that combustion-processed metal oxide thin films can be solution-processed via techniques other than spin-coating. Specifically, inkjet-printed combustion-processed oxide TFTs were demonstrated by printing In$_2$O$_3$ semiconductor channels (500 μm×5 mm lines) on an n++Si/α-alumina dielectric substrate with a Fujifilm Dimatix Materials Printer DMP-2800.

Example 4

Fabrication and Characterization of IGZO TFTs

Example 4A

Preparation of IGZO (α-In$_6$GaZn$_3$O$_{13.5}$) Precursor Composition

All reagents were purchased from Sigma-Aldrich and used as received. A 0.05M IGZO precursor solution with an In:Ga:Zn metal ratio of 6:1:3 was prepared by dissolving indium nitrate (In(NO$_3$)$_3$·2.85H$_2$O, 211.13 mg), zinc nitrate (Zn(NO$_3$)$_2$·6H$_2$O, 89.2 mg), and gallium nitrate (Ga(NO$_3$)$_3$·5.5H$_2$O, 35.5 mg) in 20 mL of 2-methoxyethanol, then adding 204 μL of acetylacetone. After complete dissolution of the metal nitrates, 114 μL of 14.5M NH$_3$ (aq) was added, and the solution was aged for 12 hours.

Example 4B

Device Fabrication and Characterization

Top-contact bottom-gate IGZO TFTs based on an n$^+$-Si/300 nm SiO$_2$/IGZO/Al configuration were fabricated and characterized. IGZO precursor solutions, with a total metal concentration of 0.05 M, were spin-coated on 300 nm SiO$_2$ wafers (WRS Materials) at 3500 r.p.m. for 35 seconds in a low humidity air environment (RH<5%), then annealed at the desired temperature (T$_{anneal}$=250° C.-350° C.) for 30 minutes. This process was repeated four times to achieve the desired film thickness. For the final post-deposition annealing step, the IGZO films were annealed at the temperature used to anneal each layer for 0.5-4 hours under an atmosphere with different relative humidities.

It was observed that by performing the post-deposition annealing step in a high relative humidity environment, the device showed higher mobility as well as lower hysteresis (FIG. 11). Specifically, the mobility increased from about 1 cm$^2$/Vs (RH=20%) to about 3 cm$^2$/Vs (RH=85%).

Top-gate bottom-contact OTFTs were fabricated on glass/ITO. ITO was patterned using lithography processes affording devices having channel length of 10 μm and width of 1000 μm. IGZO precursor solutions, with a total metal concentration of 0.05 M, were spin-coated on the substrates at about 3000-4000 r.p.m. for 35 seconds in a low humidity air environment (RH<5%), then annealed at the desired temperature (T$_{anneal}$=250° C.-350° C.) for about 30 minutes. A solution of a polyolefin dissolved in toluene was spin-coated at 1000 r.p.m. and annealed at 150° C. for 10 minutes to serve as an organic dielectric layer. These devices were completed by thermally evaporating a 50-nm thick gold gate electrode. The mobility of these devices was ~4 cm$^2$/Vs.

Top-gate bottom-contact OTFTs were fabricated on glass/ITO. ITO was patterned using lithography processes affording devices having channel length of 10 μm and width of 1000 μm. IGZO precursor solutions, with a total metal concentration of 0.05 M, were spin-coated on the substrates at about 3000-4000 r.p.m. for 35 seconds in a low humidity air environment (RH<5%), then annealed at the desired temperature (T$_{anneal}$=250° C.-350° C.) for about 30 minutes. A bilayer composed of parylene film (dielectric constant ~3) in contact with ZrO$_x$ (dielectric constant ~25) served as the gate dielectric. The parylene film was deposited from the vapor phase according to known procedures. ZrO$_x$ was sputtered and the devices were then post-annealed. The total dielectric thickness was about 200 nm. These devices were completed by thermally evaporating a 50-nm thick silver gate electrode. The mobility of these devices was ~4.5 cm$^2$/Vs.

Top-gate bottom-contact OTFTs were fabricated on glass/ITO. ITO was patterned using lithography processes affording devices having channel length of 10 μm and width of 1000 μm. IGZO precursor solutions, with a total metal concentration of 0.05 M, were spin-coated on the substrates at about 3000-4000 r.p.m. for 35 seconds in a low humidity air environment (RH<5%), then annealed at the desired temperature (T$_{anneal}$=250° C.-350° C.) for about 30 minutes. A bilayer composed of a UV-curable material (dielectric constant ~3.5) film in contact with ZrO$_x$ (dielectric constant ~25) served as the gate dielectric. The UV-curable material was spin-coated from cyclopentanone and UV-cured at 300 mJ/cm$^2$. ZrO$_x$ was sputtered and the device were then post-annealed. The total dielectric thickness was about 300 nm. These devices were completed by thermally evaporating a 50-nm thick silver gate electrode. The mobility of these devices was ~2 cm$^2$/Vs.

Example 5

Fabrication and Characterization of ZnO TFTs

Example 5A

Preparation of ZnO Precursor Composition

All reagents were purchased from Sigma-Aldrich and used as received. A 0.05M ZnO precursor solution was prepared by dissolving zinc nitrate (Zn(NO$_3$)$_2$.6H$_2$O, 148.7 mg) in 10 mL of 2-methoxyethanol, then adding 100 μL of acetylacetone. After complete dissolution of the zinc nitrate, 57 μL of 14.5M NH$_3$ (aq) was added, and the solution was aged for 12 hours.

Example 5B

Device Fabrication and Characterization

Top-contact bottom-gate ZnO TFTs based on an n$^+$-Si/300 nm SiO$_2$/ZnO/Al configuration were fabricated and characterized. The ZnO precursor solution was spin-coated on 300 nm SiO$_2$ wafers (WRS Materials) at 3500 r.p.m. for 30 seconds, then annealed at the desired temperature (T$_{anneal}$=200° C.-400° C.) for 30 minutes. This process was repeated four times to achieve the desired film thickness.

The obtained films showed poor morphology

Example 6

Fabrication and Characterization of Organic Solar Cells

Example 6A

Organic Solar Cells with Combustion-Derived NiO as Interfacial Electron-Blocking/Hole-Transport Layer In this example, bulk-heterojunction ITO/P3HT:PCBM/LiF/Al solar cells were fabricated with combustion-derived NiO as an interfacial electron-blocking/hole-transporting layer. Comparative devices were made with poly(3,4-ethylenedioxy-thiophene):poly(styrenesulfonate) (PEDOT:PSS) instead of NiO.

Specifically, NiO precursor compositions were prepared by dissolving nickel nitrate (Ni(NO$_3$)$_2$.6H$_2$O, 290.8 mg) and urea (NH$_2$CONH$_2$, 100.1 mg) in 5 mL of 2-methoxyethanol. After complete dissolution of the metal nitrate and urea, the solutions were aged for 12 hours.

Before device fabrication, patterned ITO-coated glass substrates were cleaned by ultrasonic treatment in detergent, de-ionized water, acetone, and isopropyl alcohol sequentially, and UV-ozone treatment for 40 minutes. Then, the NiO precursor composition was spin-coated on the ITO-coated glass substrates at 2000-4000 r.p.m. for 35 seconds, followed by annealing at the desired temperature (T$_{anneal}$=150° C.-400° C.) for 30 minutes under air. The process was repeated as necessary to achieve the desired film thickness. For comparative devices, a PEDOT:PSS layer of about 40 nm thickness was spin-coated from an aqueous solution (Clevios P VP AI 4083) onto ITO-coated glass substrates, followed by baking at 150° C. for 15 minutes in air. A blended solution of regioregular poly(3-hexylthiophene) (P3HT) and the fullerene derivative [6,6]-phenyl-C$_{61}$ butyric acid methyl ester (PCBM) in a 1:1 (wt:wt) ratio was spin-coated onto either the NiO-coated or PEDOT:PSS-coated ITO substrates To complete the device fabrication, a thin layer (about 0.6 nm) of lithium fluoride (LiF) and a thin layer of aluminum (about 100 nm) were successively deposited thermally under vacuum of ~10$^{-6}$ Torr. The active area of the device was 0.06 cm$^2$. The devices were then encapsulated with a cover glass using UV curable epoxy in the glove box.

OPV characterization was performed on a Spectra-Nova Class A Solar Simulator with AM 1.5G light (100 mW cm$^{-2}$) from a Xe arc lamp. The light source was calibrated with an NREL-certified Si diode equipped with a KG3 filter to bring spectral mismatch to unity. Current vs potential (J-V) measurements were recorded with a Keithley 2400 digital source meter. External quantum efficiency (EQE) was performed using an Oriel Model S3 QE-PV-SI (Newport Instruments) equipped with an NIST-certified Si-diode and a Merlin lock-in amplifier and optical chopper. Monochromatic light was generated from a 300 W Xe arc lamp.

The results are reported in Table 6 below.

TABLE 6

| HTL | $V_{oc}$ [V] | $J_{sc}$ [mA/cm$^2$] | FF [%] | PCE [%] |
|---|---|---|---|---|
| 250° C. NiO | | | | |
| 10 nm × 2 | 0.504 | 7.78 | 58 | 2.31 |
| 10 nm × 1 | 0.476 | 8.53 | 57 | 2.34 |
| 5 nm × 2 | 0.483 | 9.07 | 56 | 2.47 |
| 5 nm × 1 | 0.533 | 8.53 | 59 | 2.70 |
| 400° C. NiO | | | | |
| 10 nm × 2 | 0.524 | 8.17 | 53 | 2.29 |
| 10 nm × 1 | 0.545 | 9.31 | 58 | 2.96 |
| 5 nm × 2 | 0.533 | 9.16 | 59 | 2.88 |
| 5 nm × 1 | 0.549 | 8.66 | 57 | 2.72 |
| 30 nm PEDOT | | | | |
| 30 nm × 1 | 0.583 | 9.17 | 61 | 3.31 |

Example 6B

Organic Solar Cells with Combustion-Derived α-IZO as an Interfacial Electron-Blocking/Hole-Transporting Layer In this example, inverted solar cells based on an ITO/60 nm α-InZnO$_{2.5}$/P3HT:PCBM/PEDOT:PSS/Ag configuration were fabricated.

Specifically, α-IZO precursor compositions were prepared as follows. Indium nitrate (In(NO$_3$)$_2$.4.12H$_2$O, 375 mg) was dissolved in 5 mL of 2-methoxyethanol, to which 0.2 mL of acetylacetone was added. Zinc nitrate (Zn(NO$_3$)$_2$.6H$_2$O, 297.6 mg) was dissolved in 5 mL of 2-methoxyethanol, to which 0.2 mL of acetylacetone was added. After complete dissolution of the metal nitrate, 110 µL of 14.5 M NH$_{3(aq)}$ was added to each solution, which was then aged for 12 hours. The indium zinc oxide (IZO) precursor composition was achieved by mixing the two component solutions at the ratio of In:Zn=1:1 with stirring for one hour.

Before device fabrication, patterned ITO-coated glass substrates were cleaned by ultrasonic treatment in detergent, de-ionized water, acetone, and isopropyl alcohol sequentially, and UV-ozone treatment for 40 minutes. Then, the α-IZO precursor composition was spin-coated on the ITO-coated glass substrates at 2000 r.p.m. for 20 seconds, followed by annealing at the desired temperature (T$_{anneal}$=150° C.-250° C.) for about 20 minutes under air. The process was repeated as necessary to achieve the desired film thickness. A blended solution of regioregular poly(3-hexylthiophene) (P3HT) and the fullerene derivative [6,6]-phenyl-C$_{61}$ butyric acid methyl ester (PCBM) in a 1:1 (wt:wt) ratio was spin-coated onto the IZO layer. Subsequently, a PEDOT:PSS layer of about 40 nm thickness was spin-coated from an aqueous solution (Clevios P VP AI 4083) onto the BHJ layer, followed by baking at 150° C. for 15 minutes in air. To complete the device fabrication, a thin Ag layer was deposited thermally under vacuum of ~10$^{-6}$ Torr. The devices were then encapsulated with a cover glass using UV curable epoxy in the glove box.

The photovoltaic characteristics of the encapsulated devices were tested in air using the setup described in the previous example. The results are reported in Table 7 below.

TABLE 7

| $T_{anneal}$ (° C.) | $V_{oc}$ [V] | $J_{sc}$ [mA/cm$^2$] | FF [%] | PCE [%] |
|---|---|---|---|---|
| 250 | 0.575 | 10.9 | 53.3 | 3.39 |
| 225 | 0.562 | 10.9 | 60.0 | 3.68 |
| 200 | 0.576 | 10.9 | 62.0 | 3.90 |
| 175 | 0.574 | 10.9 | 61.6 | 3.84 |
| 150 | 0.576 | 10.7 | 55.8 | 3.45 |

Example 7

Fabrication and Characterization of Nanomaterial-Derived Metal Oxide Thin Film Devices To utilize the nanomaterial as pre-defined building block for electronic application, efficient charge carrier transport between nanomaterial is critical. This example demonstrates that the combustion precursors can be used as efficient binders between nanomaterials.

Example 7A

Fabrication and Characterization of ZnO Nanocomposite TFTs

ZnO nanorods (~60-80 nm) were synthesized following literature procedures described in Sun et al., *J. Phys. Chem. C*, 111:18831 (2007), then suspended (30 mg/mL) in chloroform/methanol (1:1). This ZnO nanorod suspension was spin-coated at 2000 r.p.m. for 30 seconds on top of HMDS-treated 300 nm SiO$_2$/p+Si, then annealed at 225° C. for 30 minutes under air. A ZnO combustion precursor composition was prepared by dissolving 297.6 mg of Zn(NO$_3$)$_2$.6H$_2$O in 2.5 mL of 2-methoxyethanol, to which 0.2 mL of acetylacetone was added. After complete dissolution of the metal nitrate, 114 µL of 14.5 M NH$_{3(aq)}$ was added, and the solution was aged for 12 hours. This ZnO combustion precursor composition was overcoated onto the ZnO nanorod film by spin-coating at 2000 r.p.m. for 30 seconds, followed by annealing at the desired temperature (200-500° C.) for 30 minutes under air. The overcoating step was performed repeatedly to fill any voids. Aluminum source and drain electrodes of 100 nm thickness were deposited by thermal evaporation (pressure ~10$^{-6}$ Torr) through a shadow mask, affording channel dimensions of 100 µm (L)×5000 µm (W). Characterization of the ZnO nanocomposite TFT devices and the control ZnO nanorod devices (i.e., without the ZnO combustion precursor overcoating) was performed on a customized probe station in air with a Keithley 6430 subfemtometer and a Keithley 2400 source meter, operated by a locally written Labview program and GPIB communication. TFT performance parameters, saturation mobility ($\mu_{Sat}$) and current on/off ($I_{on}/I_{off}$) ratio were evaluated from transfer plots with the MOSFET model described in equation 1.

Figure 12:
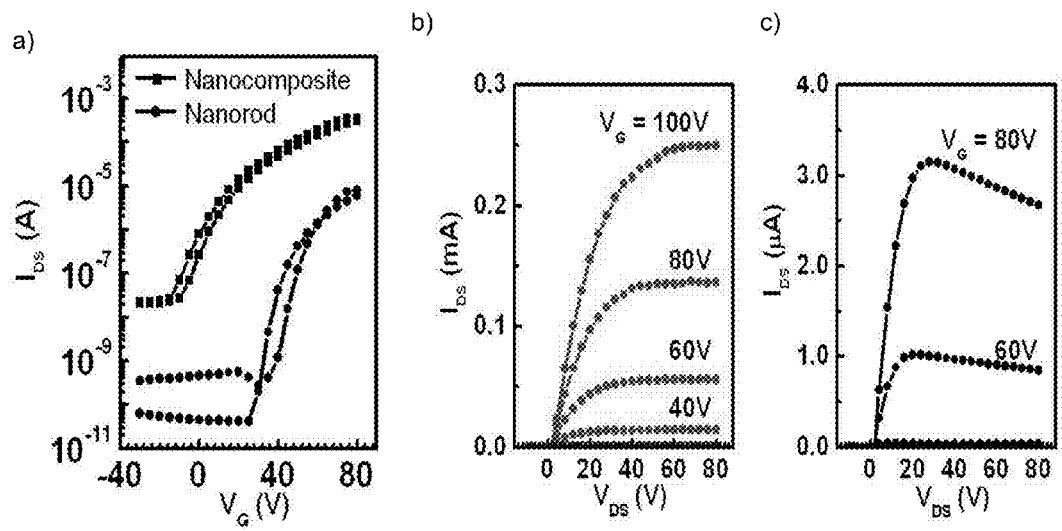

Enhanced carrier transport was confirmed with ZnO nanocomposite-based TFTs as compared to control ZnO nanorod-based TFTs. As shown in FIG. 12, field effect mobilities increased significantly from 10$^{-3}$-10$^{-2}$ cm$^2$/Vs (as measured from control ZnO nanorod-based TFTs) to 0.2 cm$^2$/Vs (as measured from ZnO nanocomposite-based TFTs).

Example 7B

Conductivity of ITO Nanocomposite Transparent Conducting Oxide Films

ITO nanoparticle sol (30 wt % in isopropylalcohol, <100 nm particle size, product #700460) was purchased from Sigma-Aldrich. This ITO nano-sol was diluted to 20 wt % in isopropylalcohol, then spin-coated at 5000 r.p.m. for 30 seconds on 300 nm $SiO_2$/p+Si substrates, then annealed at the desired temperature (100° C.-400° C.) for 30 minutes under air. An ITO combustion precursor composition was prepared as follows. Indium nitrate ($In(NO_3)_3 \cdot 2.85H_2O$, 352.3 mg) was dissolved in 2.5 mL of 2-methoxyethanol, to which 0.2 mL of acetylacetone was added. After complete dissolution of the metal nitrate, 114 μL of 14.5 M $NH_{3(aq)}$ was added, and the solution was aged for 12 hours. Tin chloride ($SnCl_2$, 189.6 mg) and ammonium nitrate ($NH_4NO_3$, 80.1 mg) was dissolved in 2.5 mL of 2-methoxyethanol, to which 0.2 mL of acetylacetone was added. After completely dissolving the inorganic salts, 57 μL of 14.5 M $NH_{3(aq)}$ was added, and the solution was aged for 12 hours. The indium tin oxide (ITO) precursor composition was achieved by mixing the two component solutions at the ratio of In:Sn=9:1 with stirring for one hour. This ITO combustion precursor composition was overcoated onto the ITO nanoparticle film by spin-coating at 2000 r.p.m. for 30 seconds, followed by annealing at the desired temperature (200-500° C.) for 30 minutes under air. The overcoating step was performed repeatedly to fill any voids. Subsequently, the ITO nanocomposite films were reduced by annealing at either the same temperature as $T_{anneal}$ (if $T_{anneal}$<300° C.) or at 300° C. (if $T_{anneal}$>300° C.) under a hydrogen atmosphere for 2 hours. Conductivities of the ITO nanocomposite films and the control ITO nanoparticle films were measured with a Keithley 2400 source meter using the four-probe method.

Figure 13:
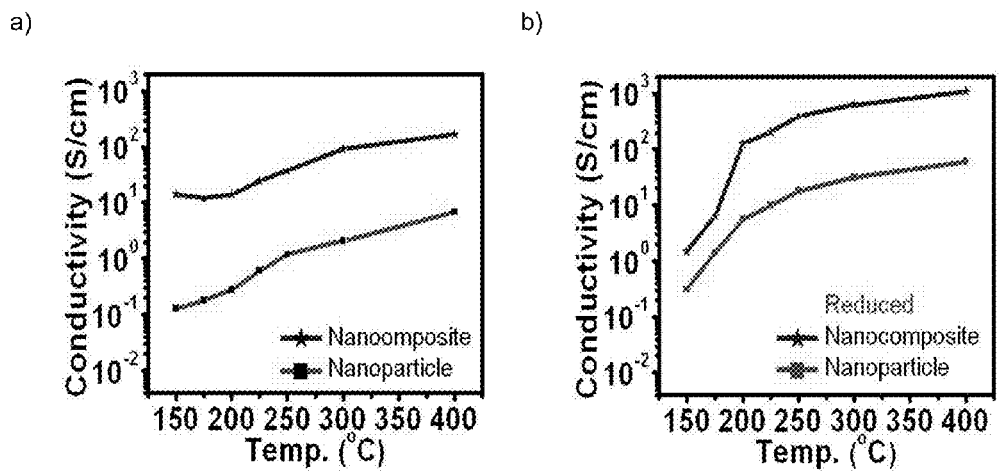

Enhanced conductivity was confirmed with the ITO nanocomposite-based TCO films as compared to the control ITO nanoparticle-based TCO films. As shown in FIG. 13, the conductivity of the nanoparticle-based ITO films increased significantly from $10^{-1}$ S/cm to about 10 S/cm by overcoating the nanoparticle-based film with an ITO combustion precursor composition. More remarkably, by overcoating or impregnating the ITO nanoparticle-based films with the present combustion precursors, a conductivity of 10 S/cm could be obtained with an annealing temperature as low as about 150° C. With post-annealing reductive treatment, the conductivity of the ITO nanocomposite-based TCO films further increased to 170 S/cm for $T_{anneal}$~200° C. While the control ITO nanoparticle-based TCO films also showed increased conductivity with post-annealing reductive treatment, the conductivity remained more than an order lower (<10 S/cm).

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. A method of fabricating a transistor device comprising a thin film semiconductor component comprising indium gallium zinc oxide (In—Ga—Zn—O), the method comprising:
   (a) depositing a thin film from a precursor composition comprising an indium salt, a gallium salt, and a zinc salt in a solvent or solvent mixture, wherein the indium salt, the gallium salt, and the zinc salt independently comprise either an oxidizing anion or a fuel anion, provided that (a) if none of the indium salt, the gallium salt and the zinc salt comprises a fuel anion, then the precursor composition further comprises either a fuel or an ammonium salt comprising a fuel anion, and (b) if none of the indium salt, the gallium salt and the zinc salt comprises an oxidizing anion, then the precursor composition further comprises either an acid comprising an oxidizing anion or an inorganic salt comprising an oxidizing anion, wherein:
   the fuel is selected from acetylacetone, $CF_3COCH_2COCF_3$, $CH_3COCHFCOCH_3$, $CH_3COCH_2C(=NH)CF_3$, $CH_3C(=NH)CHFC(=NH)CH_3$, $CH_3COCH_2C(=NCH_3)CF_3$, $CH_3C(=NCH_3)CHFC(=NCH_3)CH_3$, $CH_3C(=NH)CHFC(=NCH_3)CH_3$, $Ph_2POCH_2COCH_3$, urea, N-methylurea, citric acid, ascorbic acid, stearic acid, nitromethane, hydrazine, carbohydrazide, oxalyl dihydrazide, malonic acid dihydrazide, tetra formal tris azine, hexamethylenetetramine, and malonic anhydride,
   the fuel anion is selected from acetylacetonate, a citrate, an oxalate, an ascorbate, and a stearate,
   the oxidizing anion is selected from a nitrate, a perchlorate, a chlorate, a hypochlorite, an azide, a peroxide, a superoxide, a high-valent oxide, an N-oxide, a persulfate, a dinitramide, a nitrocyanamide, a nitroarylcarboxylate, a tetrazolate, and hydrates thereof, and
   the oxidizing anions and the fuel and fuel anions in the precursor composition are present in amounts to allow metal oxide formation and complete combustion of the fuel and fuel anions;
   (b) annealing the thin film at a temperature of less than or about 350° C. to initiate a combustion reaction between the oxidizing anions and the fuel and fuel anions, thereby to forming a thin film semiconductor component comprising indium gallium zinc oxide (In—Ga—Zn—O) and converting the fuel and fuel anions into $CO_2$, $H_2O$, and optionally, $N_2$; and
   (c) repeating steps (a) and (b) one or more times by depositing an overlying thin film on any previously deposited and annealed thin film, wherein each thin film formed by a single cycle of steps (a) and (b) has a thickness of less than or about 50 nm,
to provide a transistor device comprising a thin film semiconductor component comprising indium gallium zinc oxide (In—Ga—Zn—O), wherein the transistor device exhibits a charge mobility of about 3 $cm^2$/Vs or higher.

2. The method of claim 1 comprising coupling the metal oxide thin film directly or indirectly to a flexible substrate.

3. The method of claim 1, wherein the solvent or solvent mixture comprises an alkoxyalcohol.

4. The method of claim 1, wherein the annealing step is performed at a temperature of less than or about 150° C.

5. The method of claim 1, wherein each thin film formed by a single cycle of steps (a) and (b) has a thickness of less than or about 20 nm.

6. The method of claim 1, further comprising providing a metal oxide thin film dielectric, wherein providing the metal oxide thin film dielectric comprises:
   depositing a thin film from a dielectric precursor composition comprising a fuel and one or more oxidizing agents in a solvent or solvent mixture, wherein the fuel and/or at least one of the oxidizing agent(s) comprise a metal salt comprising aluminum or cerium, and wherein the fuel and the one or more oxidizing agents are present in amounts to allow metal oxide formation and complete combustion of the fuel and fuel anions; and annealing the thin film at a temperature less than or about 350° C. with or without exposure to a radiation source, thereby providing a metal oxide thin film dielectric and converting the fuel into $CO_2$, $H_2O$, and optionally, $N_2$.

7. The method of claim 1, further comprising providing a metal oxide thin film conductor, wherein providing the metal oxide thin film conductor comprises:

depositing a thin film from a conductor precursor composition comprising a fuel and one or more oxidizing agents in a solvent or solvent mixture, wherein the fuel and/or at least one of the oxidizing agent(s) comprise a metal salt, and wherein the fuel and the one or more oxidizing agents are present in amounts to allow metal oxide formation and complete combustion of the fuel and fuel anions; and annealing the thin film at a temperature less than or about 350° C. with or without exposure to a radiation source, thereby providing a metal oxide thin film dielectric and converting the fuel into $CO_2$, $H_2O$, and optionally, $N_2$.

8. The method of claim 1 further comprising coupling the metal oxide thin film directly to an organic layer.

9. The method of claim 1, wherein the depositing step is carried out by spin-coating, slot-coating, drop-casting, zone casting, dip coating, blade coating, spray-coating, rod coating, or stamping.

10. The method of claim 1, wherein each of the indium salt, the gallium salt, and the zinc salt comprises an oxidizing anion selected from a nitrate, a perchlorate, a chlorate, a hypochlorite, an azide, a peroxide, a superoxide, a high-valent oxide, an N-oxide, a persulfate, a dinitramide, a nitrocyanamide, a nitroarylcarboxylate, a tetrazolate, and hydrates thereof, and the precursor composition further comprises a fuel selected from acetylacetone, $CF_3COCH_2COCF_3$, $CH_3COCHFCOCH_3$, $CH_3COCH_2C(=NH)CF_3$, $CH_3C(=NH)CHFC(=NH)CH_3$, $CH_3COCH_2C(=NCH_3)CF_3$, $CH_3C(=NCH_3)CHFC(=NCH_3)CH_3$, $CH_3C(=NH)CHFC(=NCH_3)CH_3$, $Ph_2POCH_2COCH_3$, urea, N-methylurea, citric acid, ascorbic acid, stearic acid, nitromethane, hydrazine, carbohydrazide, oxalyl dihydrazide, malonic acid dihydrazide, tetra formal tris azine, hexamethylenetetramine, and malonic anhydride.

11. The method of claim 1, wherein each of the indium salt, the gallium salt, and the zinc salt comprises nitrate or a hydrate thereof.

12. The method of claim 11, wherein the precursor composition further comprises a fuel selected from acetylacetone, $CF_3COCH_2COCF_3$, $CH_3COCHFCOCH_3$, $CH_3COCH_2C(=NH)CF_3$, $CH_3C(=NH)CHFC(=NH)CH_3$, $CH_3COCH_2C(=NCH_3)CF_3$, $CH_3C(=NCH_3)CHFC(=NCH_3)CH_3$, $CH_3C(=NH)CHFC(=NCH_3)CH_3$, $Ph_2POCH_2COCH_3$, urea, N-methylurea, citric acid, ascorbic acid, stearic acid, nitromethane, hydrazine, carbohydrazide, oxalyl dihydrazide, malonic acid dihydrazide, tetra formal tris azine, hexamethylenetetramine, and malonic anhydride.

13. The method of claim 12, wherein the precursor composition further comprises a base.

14. A method of fabricating a transistor device comprising a thin film semiconductor component comprising indium gallium zinc oxide (In—Ga—Zn—O), the method comprising:

(a) depositing a thin film from a precursor composition comprising an indium salt, a gallium salt, and a zinc salt in a solvent or solvent mixture, wherein the indium salt, the gallium salt, and the zinc salt independently comprise either an oxidizing anion or a fuel anion, provided that (a) if none of the indium salt, the gallium salt and the zinc salt comprises a fuel anion, then the precursor composition further comprises either a fuel or an ammonium salt comprising a fuel anion, and (b) if none of the indium salt, the gallium salt and the zinc salt comprises an oxidizing anion, then the precursor composition further comprises either an acid comprising an oxidizing anion or an inorganic salt comprising an oxidizing anion, wherein:

the fuel is selected from acetylacetone, $CF_3COCH_2COCF_3$, $CH_3COCHFCOCH_3$, $CH_3COCH_2C(=NH)CF_3$, $CH_3C(=NH)CHFC(=NH)CH_3$, $CH_3COCH_2C(=NCH_3)CF_3$, $CH_3C(=NCH_3)CHFC(=NCH_3)CH_3$, $CH_3C(=NH)CHFC(=NCH_3)CH_3$, $Ph_2POCH_2COCH_3$, urea, N-methylurea, citric acid, ascorbic acid, stearic acid, nitromethane, hydrazine, carbohydrazide, oxalyl dihydrazide, malonic acid dihydrazide, tetra formal tris azine, hexamethylenetetramine, and malonic anhydride, the fuel anion is selected from acetylacetonate, a citrate, an oxalate, an ascorbate, and a stearate, the oxidizing anion is selected from a nitrate, a perchlorate, a chlorate, a hypochlorite, an azide, a peroxide, a superoxide, a high-valent oxide, an N-oxide, a persulfate, a dinitramide, a nitrocyanamide, a nitroarylcarboxylate, a tetrazolate, and hydrates thereof, and the oxidizing anions and the fuel and fuel anions in the precursor composition are present in amounts to allow metal oxide formation and complete combustion of the fuel and fuel anions;

(b) annealing the thin film at a temperature of less than or about 250° C. to initiate a combustion reaction between the oxidizing anions and the fuel and fuel anions, thereby forming a thin film semiconductor component comprising indium gallium zinc oxide (In—Ga—Zn—O) and converting the fuel and fuel anions into $CO_2$, $H_2O$, and optionally, $N_2$; and (c) repeating steps (a) and (b) one or more times by depositing an overlying thin film on any previously deposited and annealed thin film, wherein each thin film formed by a single cycle of steps (a) and (b) has a thickness of less than or about 50 nm, to provide a transistor device comprising a thin film semiconductor component comprising indium gallium zinc oxide (In—Ga—Zn—O), wherein the transistor device exhibits a charge mobility of about 3 $cm^2$/Vs or higher.

15. A method of fabricating a transistor device comprising a thin film semiconductor component comprising indium gallium zinc oxide (In—Ga—Zn—O), the method comprising:

(a) depositing a thin film from a precursor composition comprising an indium salt, a gallium salt, and a zinc salt in a solvent or solvent mixture, wherein the indium salt, the gallium salt, and the zinc salt independently comprise either an oxidizing anion or a fuel anion, provided that (a) if none of the indium salt, the gallium salt and the zinc salt comprises a fuel anion, then the precursor composition further comprises either a fuel or an ammonium salt comprising a fuel anion, and (b) if none of the indium salt, the gallium salt and the zinc salt comprises an oxidizing anion, then the precursor composition further comprises either an acid comprising an oxidizing anion or an inorganic salt comprising an oxidizing anion, wherein:

the fuel is selected from acetylacetone, $CF_3COCH_2COCF_3$, $CH_3COCHFCOCH_3$, $CH_3COCH_2C(=NH)CF_3$, $CH_3C(=NH)CHFC(=NH)CH_3$, $CH_3COCH_2C(=NCH_3)CF_3$, $CH_3C(=NCH_3)CHFC(=NCH_3)CH_3$, $CH_3C(=NH)CHFC(=NCH_3)CH_3$, $Ph_2POCH_2COCH_3$, urea, N-methylurea, citric acid, ascorbic acid, stearic acid, nitromethane, hydrazine, carbohydrazide, oxalyl dihydrazide, malonic acid dihydrazide, tetra formal tris azine, hexamethylenetetramine, and malonic anhydride, the fuel anion is selected from acetylacetonate, a citrate, an oxalate, an ascorbate, and a stearate, the oxidizing anion is selected from a nitrate, a perchlorate, a chlorate, a hypochlorite, an azide, a peroxide, a superoxide, a high-valent oxide, an N-oxide, a persulfate, a dinitramide, a nitrocyanamide, a nitroarylcarboxylate, a tetrazolate, and hydrates thereof, and the oxidizing anions and the fuel and fuel anions in the precursor composition are present in amounts to allow metal oxide formation and complete combustion of the fuel and fuel anions;

(b) annealing the thin film at a temperature of less than or about 350° C., wherein the annealing step consists of heat treatment without irradiation, to initiate a combustion reaction between the oxidizing anions and the fuel and fuel anions, thereby forming a thin film semiconductor component comprising indium gallium zinc oxide (In—Ga—Zn—O) and converting the fuel and fuel anions into $CO_2$, $H_2O$, and optionally, $N_2$; and (c) repeating steps (a) and (b) one or more times by depositing an overlying thin film on any previously deposited and annealed thin film, wherein each thin film formed by a single cycle of steps (a) and (b) has a thickness of less than or about 50 nm, to provide a transistor device comprising a thin film semiconductor component comprising indium gallium zinc oxide (In—Ga—Zn—O), wherein the transistor device exhibits a charge mobility of about 3 $cm^2/Vs$ or higher.

* * * * *